(12) United States Patent
Snaith et al.

(10) Patent No.: US 10,580,585 B2
(45) Date of Patent: Mar. 3, 2020

(54) TWO-STEP DEPOSITION PROCESS

(71) Applicant: OXFORD UNIVERSITY INNOVATION LIMITED, Oxford (GB)

(72) Inventors: Henry J. Snaith, Oxford (GB); Giles E. Eperon, Oxford (GB); James M. Ball, Oxford (GB)

(73) Assignee: OXFORD UNIVERSITY INNOVATION LIMITED, Botley, Oxford (GB)

(*) Notice: Subject to any disclaimer, the term of this patent is extended or adjusted under 35 U.S.C. 154(b) by 0 days.

(21) Appl. No.: 15/323,823

(22) PCT Filed: Jul. 9, 2015

(86) PCT No.: PCT/GB2015/051993
§ 371 (c)(1),
(2) Date: Jan. 4, 2017

(87) PCT Pub. No.: WO2016/005758
PCT Pub. Date: Jan. 14, 2016

(65) Prior Publication Data
US 2017/0148579 A1    May 25, 2017

(30) Foreign Application Priority Data
Jul. 9, 2014   (GB) .................................. 1412201.4

(51) Int. Cl.
*H01L 21/00*    (2006.01)
*H01G 9/20*    (2006.01)
(Continued)

(52) U.S. Cl.
CPC ....... *H01G 9/2009* (2013.01); *C23C 14/0021* (2013.01); *C23C 14/0694* (2013.01);
(Continued)

(58) Field of Classification Search
CPC ............ C23C 16/409; C23C 16/45553; C23C 16/45557; H01L 51/0002; H01L 51/006; H01L 51/0077; H01L 51/422
See application file for complete search history.

(56) References Cited

U.S. PATENT DOCUMENTS 5,618,761 A    4/1997    Eguchi et al.
6,391,803 B1    5/2002    Kim et al.
(Continued)

FOREIGN PATENT DOCUMENTS

CN    103682153 A    3/2014
WO    2012003341 A2    1/2012
WO    2014045021 A1    3/2014

OTHER PUBLICATIONS

Ball, et al., Low-Temperature Processed Meso-Superstructured to Thin-Film Perovskite Solar Cells, Energy & Environmental Science, 2013, 6:1739-1743.
(Continued)

*Primary Examiner* — Richard A Booth
(74) *Attorney, Agent, or Firm* — Quarles & Brady LLP

(57) ABSTRACT

The present invention provides a process for producing a layer of a crystalline material comprising a perovskite or a hexahalometallate, which process comprises: (i) exposing a substrate to a vapour comprising a first precursor compound in a first chamber to produce a layer of the first precursor compound on the substrate; and (ii) exposing the layer of the first precursor compound to a vapour comprising a second precursor compound in a second chamber to produce the layer of a crystalline material, wherein the pressure in the second chamber is above high vacuum. The invention also provides a process for producing a layer of a crystalline material comprising a perovskite or a hexahalometallate, which process comprises exposing a layer of a first precursor compound on a substrate to a vapour comprising a second
(Continued)

precursor compound in a chamber to produce the layer of a crystalline material, wherein the pressure in the chamber is greater than high vacuum and less than atmospheric pressure. The invention also provides a process for producing a semiconductor device comprising a layer of a crystalline material, which process comprises producing said layer of a crystalline material by a process as according to the invention.

27 Claims, 19 Drawing Sheets

(51) Int. Cl.
| | |
|---|---|
| C23C 14/24 | (2006.01) |
| C23C 14/12 | (2006.01) |
| C23C 14/06 | (2006.01) |
| C23C 14/58 | (2006.01) |
| C23C 14/00 | (2006.01) |
| H01L 51/00 | (2006.01) |
| C23C 16/40 | (2006.01) |
| C23C 16/455 | (2006.01) |
| H01L 51/42 | (2006.01) |
| H01L 31/0256 | (2006.01) |

(52) U.S. Cl.
CPC ............ *C23C 14/12* (2013.01); *C23C 14/24* (2013.01); *C23C 14/5846* (2013.01); *C23C 14/5893* (2013.01); *C23C 16/409* (2013.01); *C23C 16/45553* (2013.01); *C23C 16/45557* (2013.01); *H01G 9/2027* (2013.01); *H01L 51/0002* (2013.01); *H01L 51/006* (2013.01); *H01L 51/0032* (2013.01); *H01L 51/0077* (2013.01); *H01L 51/422* (2013.01); *H01L 51/0056* (2013.01); *H01L 51/4226* (2013.01); *H01L 2031/0344* (2013.01); *H01L 2251/306* (2013.01); *Y02E 10/549* (2013.01); *Y02P 70/521* (2015.11)

(56) References Cited

U.S. PATENT DOCUMENTS

| | | | |
|---|---|---|---|
| 7,858,144 B2 | 12/2010 | Freeman et al. | |
| 2004/0058492 A1 | 3/2004 | Tatsumi | |
| 2005/0045092 A1 | 3/2005 | Wu et al. | |
| 2011/0318888 A1 | 12/2011 | Komatsu et al. | |
| 2012/0021570 A1 | 1/2012 | Tajima et al. | |
| 2013/0171349 A1* | 7/2013 | Takahashi | C23C 16/52 427/255.23 |

OTHER PUBLICATIONS

Burschka, et al., Sequential Deposition as a Route to High-Performance Perovskite-Sensitized Solar Cells, Nature, 2013, 499:316-319.
Chen, et al., Planar Heterojunction Perovskite Solar Cells Via Vapor-Assisted Solution Process, Journal of the American Chemical Society, 2013, 136(2):622-625.
Eperon, et al., Formamidinium Lead Trihalide: A Broadly Tunable Perovskite for Efficient Planar Heterojunction Solar Cells, Energy & Environmental Science, 2014, 7:982-988.
Eperon, et al., Morphological Control for High Performance, Solution-Processed Planar Heterojunction Perovskite Solar Cells, Advanced Functional Materials, 2014, 24:151-157.
Ha, et al., Synthesis of Organic-Inorganic Lead Halide Perovskite Nanoplatelets: Towards High-Performance Perovskite Solar Cells and Optoelectronic Devices, Advanced Optical Materials, 2014, 2(9):838-844.
Haber, Manual on Catalyst Characterization, Pure & Appl. Chem., 1991, 63(9):1227-1246.
Hu, et al., Vapour-Based Processing of Hole-Conductor-Free $CH_3NH_3PbI_3$ perovskite/C60 Fullerene Planar Solar Cells, RSC Advances, 2014, 4:28964-28967.
Kim, et al., Lead Iodide Perovskite Sensitized All-Solid-State Submicron Thin Film Mesoscopic Solar Cell With Efficiency Exceeding 9%, Scientific Reports, 2012, 2: 591, 7 pp.
Kitazawa, et al., Optical Properties of Organic-Inorganic Hybrid Films Prepared by the Two-Step Growth Process, Journal of Luminescence, 2009, 129:1036-1041.
Liu, D., et al., Perovskite Solar Cells with a Planar Heterojunction Structure Prepared Using Room-Temperature Solution Processing Techniques, Nature Photonics, 2014, 8:133-138.
Liu, M., et al., Efficient Planar Heterojunction Perovskite Solar Cells by Vapour Deposition, Nature, 2013, 501:395-398.
Noh, et al., Chemical Management for Colorful, Efficient and Stable Inorganic-Organic Hybrid Nanostructured Solar Cells, Nano Letters, 2013, 13(4):1764-1769.
Rouquerol, et al., Recommendations for the Characterization of Porous Solids, Pure & Appl. Chem., 1994, 66(8):1739-1758.
Sing, et al., Reporting Physisorption Data for Gas/Solid Systems With Special Reference to the Determination of Surface Area and Porosity, Pure & Appl. Chem., 1985, 57(4):603-619.
Stranks, et al., Electron-Hole Diffusion Lengths Exceeding 1 Micrometer in an Organometal Trihalide Perovskite Absorber, Science, 2013, 342:341-344.
Yoon, et al., Vapor Deposition of Organic-Inorganic Hybrid Perovskite Thin-Films for Photovoltaic Applications, In Photovoltaic Specialist Conference (PVSC), 2014 IEEE 40th, pp. 1577-1580.
George, Atomic Layer Deposition: An Overview, Chem. Rev., 2010, 110:111-131.
The State Intellectual Property Office of China, First Office Action, Application No. 201580037211.5, dated Jul. 17, 2018, 14 pages.

* cited by examiner

TWO-STEP DEPOSITION PROCESS

CROSS-REFERENCE TO RELATED APPLICATIONS

This application represents the national stage entry of PCT International Application No. PCT/GB2015/051993 filed Jul. 9, 2015 and claims priority to Great Britain Patent Application No. 1412201.4 filed on Jul. 9, 2014. The contents of this application are hereby incorporated by reference as if set forth in their entirety herein.

FIELD OF THE INVENTION

The present invention relates to a process for producing a layer of a crystalline material. A process for producing a semiconductor device comprising a layer of a crystalline material is also described.

The work leading to this invention has received funding from the European Community's Seventh Framework Programme (FP7/2007-2013) under grant agreement no. 279881.

BACKGROUND OF THE INVENTION

Hybrid organic-inorganic perovskite materials have recently become a topic of extreme interest for photovoltaics, with devices based on these materials now reaching power conversion efficiencies of above 15%. Other photoactive crystalline materials are also of substantial current interest.

The key to achieving the highest efficiencies with this material appears to be optimisation of the perovskite or crystalline material film quality. Typically, perovskite and other crystalline films have been deposited by spin-coating a precursor containing necessary components to form the perovskite: a metal halide and an organic component. However, spin-coating is by its very nature a process which can easily result in non-uniform films or films with pinholes. Spin-coating is highly susceptible to microscopic amounts of dust on the substrate, precipitates in the solution, local atmosphere composition and temperature, and human error when depositing. These factors combine to make spin-coating an inherently poorly reproducible process for producing organometal perovskites and other crystalline materials. Moreover, spin-coating is a process which cannot be easily scaled up.

A key breakthrough was achieved by Liu, Snaith et al. (Liu, M.; Johnston, M. B.; Snaith, H. J. Efficient Planar Heterojunction Perovskite Solar Cells by Vapour Deposition. Nature 2013, 501, 395-398), who describe a high vacuum two-source vapour deposition technique to produce extremely uniform, high quality perovskite films, resulting in the most efficient devices at the time. However, this is a costly process; it requires large quantities of the reagents as well as high temperatures and most importantly, a high vacuum chamber.

Additionally, due to the volatile nature of the organic component employed, it is difficult to control the rate of its deposition, making this process difficult to reproduce between batches.

A second breakthrough was achieved by Burschka et al. (Burschka, J.; Pellet, N.; Moon, S.-J.; Humphry-Baker, R.; Gao, P.; Nazeeruddin, M. K.; Grätzel, M. Sequential Deposition as a Route to High-Performance Perovskite-Sensitized Solar Cells. Nature 2013, 499, 316-319) who describe a two-step deposition route to form high-quality perovskite films using solution-processing. The metal halide component is spin-coated on a meso-structured substrate and the layer of the metal halide is subsequently dipped in a solution containing the dissolved organic component. The perovskite film forms spontaneously. Recent research has pointed to planar perovskite heterojunction solar cells having the greatest potential to reach the highest efficiencies, rather than those based on a meso-structured (e.g. mesoporous) oxide, and hence the two-step approach was recently adapted for planar solar cells by Liu, Kelly et al. (Liu, D.; Kelly, T. L. Perovskite Solar Cells with a Planar Heterojunction Structure Prepared Using Room-Temperature Solution Processing Techniques. Nat. Photonics 2013, 1-6). This produced some of the most efficient perovskite solar cells to date. However, the films produced in this way are substantially non-uniform and the surface of the perovskite layer comprises large crystallites of greater than a micron in size. The presence of these crystallites causes high surface roughness. This is likely to be an issue in Willis of reproducibility: if an electrode touches a crystallite of the perovskite penetrating the hole-transport layer it can provide a recombination pathway, lowering device performance and affecting reproducibility. For the best solar cells, an extremely flat perovskite surface would be optimal, allowing only a thin layer of hole transporting material to be employed, and hence minimising resistive losses in that layer.

In light of this, the most recent development for making smooth perovskite films was made by Chen, Yang et al. (Chen, Q.; Zhou, H.; Hong, Z.; Luo, S.; Duan, H.-S.; Wang, H.-H.; Liu, Y.; Li, G.; Yang, Y. Planar Heterojunction Perovskite Solar Cells via Vapor Assisted Solution Process. J. Am. Chem. Soc. 2013, 3-6), who have modified the two-step deposition process, in the planar perovskite solar cell configuration, by replacing the solution-phase organic dipping step with an atmospheric pressure vapour-phase conversion, where the spincoated metal halide is annealed in an atmosphere of the sublimed organic component to convert it to the perovskite. This results in perovskite films of low roughness and high purity. However, this procedure still makes use of spin-coating to form the metal halide initial film, which results in the aforementioned issues with reproducibility and non-uniformity.

Kitazawa et al. (Kitazawa, N.; Yaemponga, D.; Aono, M.; Watanabe, Y. Optical Properties of Organicinorganic Hybrid Films Prepared by the Two-Step Growth Process. J. Lumin. 2009, 129, 1036-1041) describes a process to fabricate nanocrystal-sized $(C_8H_{17}NH_3)PbBr_4$, using two high vacuum stages. A first vacuum evaporation of a metal halide layer followed by a second vacuum evaporation of an organic halide. A sequential two-step vacuum deposition process is also described in Hu et al. (H. Hu, D. Wang, Y. Zhou, J. Zhang, S. Lv, S. Pang, X. Chen, Z. Liu, N. P. Padture and G. Cui, RSC Adv., 2014, DOI: 10.1039/C4RA03820G).

Methods which make use of vacuum evaporation to form the metal halide layer followed by completion of the perovskite by dipping the vacuum evaporated metal halide layer in a solution of the organic component have not succeeded in producing high quality films. The use of a second solution-based step results in unsuitable perovskite films comprising large crystals and unstable device performance (see Comparative Example 2).

Thus, it is an object of the invention to provide an effective process for the production of perovskite layers. In particular, it is desirable to produce layers of a crystalline material (e.g. perovskite) by a process which is readily reproducible, easy to scale up and produces layers of a crystalline material having a flat surface.

SUMMARY OF THE INVENTION

Here a new approach to prepare extremely smooth, pinhole-free perovskite (and other crystalline material) films of high purity, for use in photovoltaics and other optical and semiconducting applications is presented. The technique makes use of a two-stage vapour phase technique to ensure extremely high quality of films, with no solution-processing required at all. For instance, initially the metal halide can be deposited via thermal vapour deposition, under high vacuum, to produce a high quality, smooth and pinhole-free film. Subsequently, the film is placed and optionally heated in an atmosphere saturated with the sublimed organic component, causing it to undergo conversion to the perovskite. The advantage of this technique over the previously developed methods is two-fold. Firstly, no solution-processing is required, which enables the most uniform and high quality films to be produced. Secondly, by carrying out the film fabrication in two stages, and depositing the organic at relatively high pressures and relatively low temperatures, it is a much more controlled and reproducible method than the dual source, high vacuum method of Liu, Snaith et al. The process of the invention allows high efficiency perovskite solar cells to be fabricated, and furthermore can enable the fabrication of new perovskite or perovskite-like hybrid materials. The process of the invention circumvents the problems of prior art approaches (for instance Chen et al.) by employing solvent-free vapour deposition approaches. Furthermore, the use of a two-stage vapour process allows materials which have poor solubilities to be used. For instance, the process allows the production of new copper based materials.

The invention provides a process for producing a layer of a crystalline material that comprises a perovskite or a hexahalometallate, which process comprises:
  (i) exposing a substrate to a vapour comprising a first precursor compound in a first chamber to produce a layer of the first precursor compound on the substrate; and
  (ii) exposing the layer of the first precursor compound to a vapour comprising a second precursor compound in a second chamber to produce the layer of a crystalline material, wherein the pressure in the second chamber is greater than or equal to 1 mbar.

In step (i) the substrate may be exposed to a directional vapour comprising the first precursor compound. In step (ii) the layer of the first precursor compound may be exposed to a non-directional vapour comprising the second precursor compound. The first chamber and the second chamber are preferably different chambers.

The invention also provides a process for producing a layer of a crystalline material that comprises a perovskite or a hexahalometallate, which process comprises:
  (i) exposing a substrate to a vapour comprising a first precursor compound in a first chamber to produce a layer of the first precursor compound on the substrate, wherein the first chamber is under a high vacuum; and
  (ii) exposing the layer of the first precursor compound to a vapour comprising a second precursor compound in a second chamber to produce the layer of a crystalline material, wherein the second chamber is not under a high vacuum. Preferably, the pressure in the second chamber is also less than atmospheric pressure.

In step (i) the substrate may be exposed to a directional vapour comprising the first precursor compound. In step (ii) the layer of the first precursor compound may be exposed to a non-directional vapour comprising the second precursor compound. The first chamber and the second chamber are preferably different chambers.

The pressure in the first chamber may be less than or equal to $10^{-4}$ mbar, and preferably the pressure in the first chamber is less than or equal to $10^{-5}$ mbar. The pressure in the second chamber may be not less than $10^{-4}$ mbar, and preferably the pressure in the second chamber is greater than or equal to 1 mbar.

The invention also provides a layer of a crystalline material obtainable by a process according to the invention for producing a layer of a crystalline material.

The invention also provides a process for producing a semiconductor device comprising a layer of a crystalline material, which process comprises producing said layer of a crystalline material by a process according to the invention for producing a layer of a crystalline material. A semiconductor device obtainable by a process according to the invention is also provided.

DETAILED DESCRIPTION OF THE INVENTION

Definitions

Figure 1:
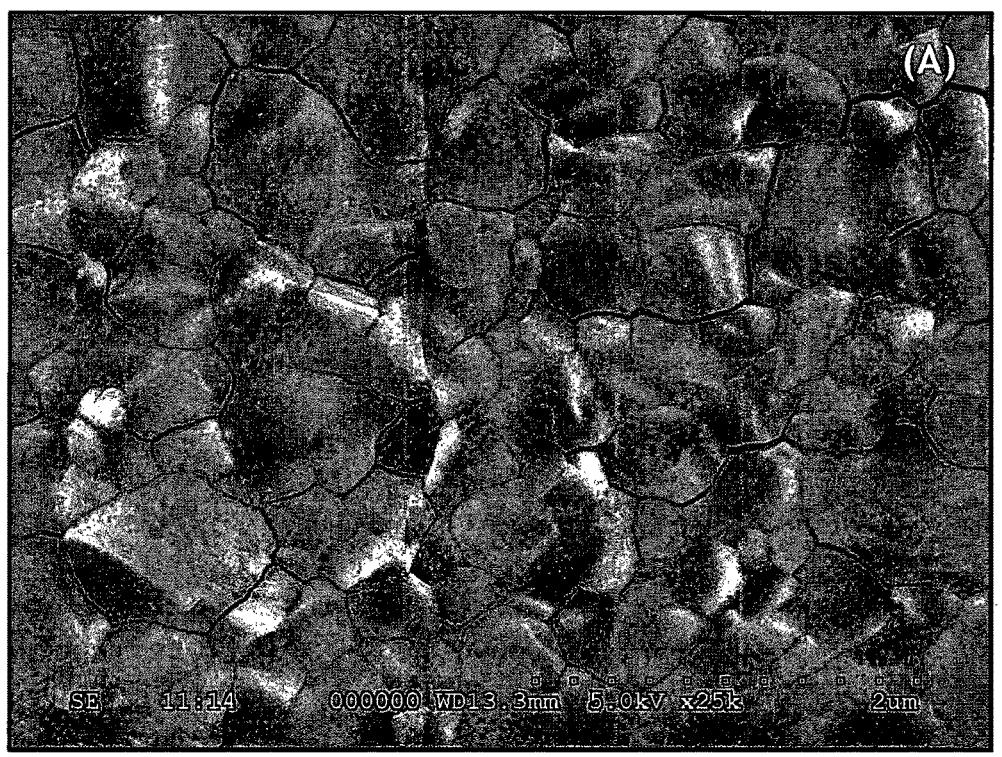
FIG. 1 shows scanning electron microscope images of (A) a top-view of a perovskite film grown by two-step vapour deposition, (B) short and (C) large scale cross-sections of devices incorporating a perovskite film grown by two-step vapour deposition.
Figure 1:
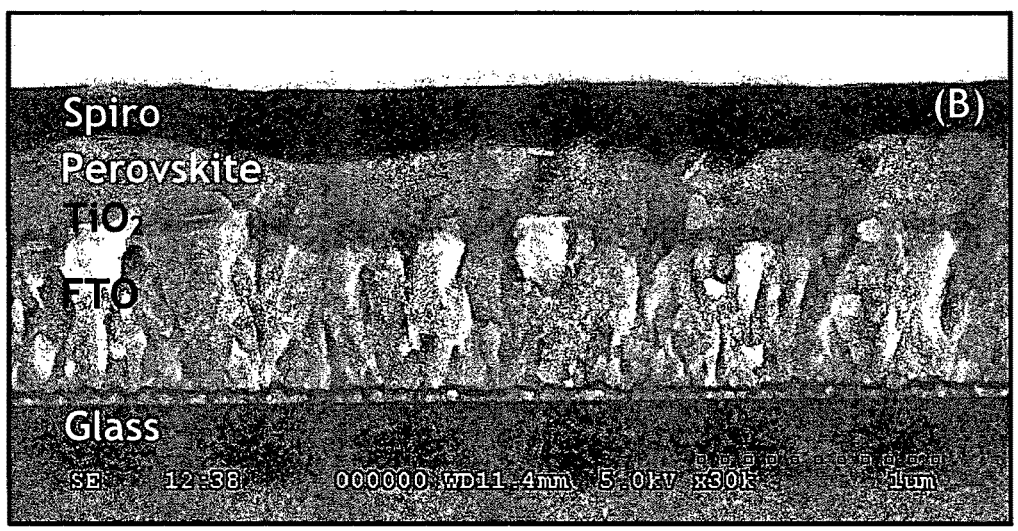
Figure 1:
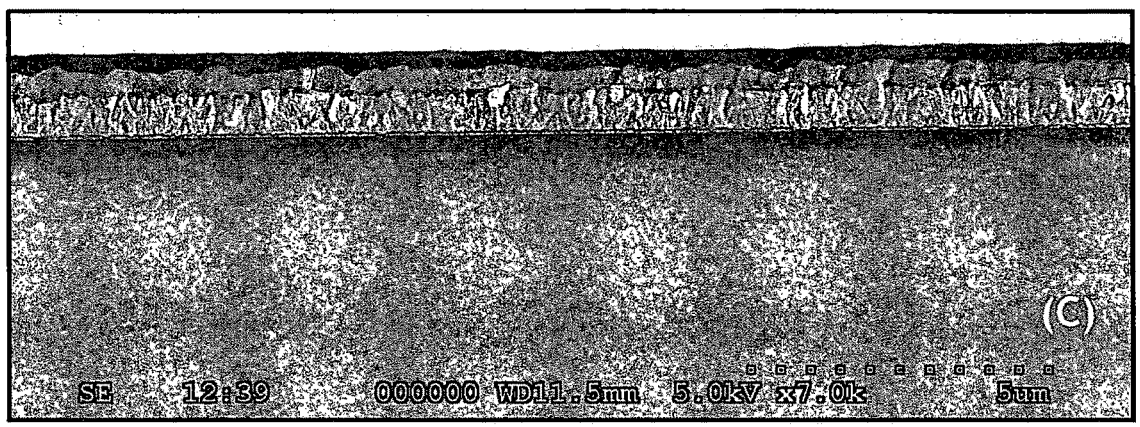

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula [A][B][X]$_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

The term "metal halide perovskite", as used herein, refers to a perovskite, the formula of which contains at least one metal cation and at least one halide anion. The taint "organometal halide perovskite", as used herein, refers to a metal halide perovskite, the formula of which contains at least one organic cation.

The term "hexahalometallate", as used herein, refers to a compound which comprises an anion of the formula $[MX_6]^{n-}$ wherein M is a metal atom, each X is independently a halide anion and n is an integer from 1 to 4.

The term "chalcogenide" refers to anions of the elements of group 16, for instance $O^{2-}$, $S^{2-}$, $Se^{2-}$, or $Te^{2-}$. Typically, the chalcogenides are taken to be $S^{2-}$, $Se^{2-}$, and $Te^{2-}$.

The term "monocation", as used herein, refers to any cation with a single positive charge, i.e. a cation of formula $A^+$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "tetracation", as used herein, refers to any cation with a quadruple positive charge, i.e. a cation of formula $A^{4+}$ where A is any moiety, for instance a metal atom.

The term "alkyl", as used herein, refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl", as used herein, refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a C3-8 cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl, and cyclohexyl.

The term "alkenyl", as used herein, refers to a linear or branched chain hydrocarbon radical comprising one or more double bonds. An alkenyl group may be a $C_{2-20}$ alkenyl group, a $C_{2-14}$ alkane group, a $C_{2-10}$ alkenyl group, a $C_{2-6}$ alkenyl group or a $C_{2-4}$ alkenyl group. Examples of a $C_{2-10}$ alkenyl group are ethenyl (vinyl), propenyl, butenyl, pentenyl, hexenyl, heptenyl, octenyl, nonenyl or decenyl. Examples of $C_{2-6}$ alkenyl groups are ethenyl, propenyl, butenyl, pentenyl or hexenyl. Examples of $C_{24}$ alkenyl groups are ethenyl, propenyl, n-propenyl, s-butenyl or n-butenyl. Alkenyl groups typically comprise one or two double bonds.

The term "alkynyl", as used herein, refers to a linear or branched chain hydrocarbon radical comprising one or more triple bonds. An alkynyl group may be a $C_{2-20}$ alkynyl group, a $C_{2-14}$ alkynyl group, a $C_{2-10}$ alkynyl group, a $C_{2-6}$ alkynyl group or a $C_{2-4}$ alkynyl group. Examples of a $C_{2-10}$ alkynyl group are ethynyl, propynyl, butynyl, pentynyl, hexynyl, heptynyl, octynyl, nonynyl or decynyl. Examples of C1-6 alkynyl groups are ethynyl, propynyl, butynyl, pentynyl or hexynyl. Alkynyl groups typically comprise one or two triple bonds.

The term "aryl", as used herein, refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group", as used herein, includes heteroaryl groups. The term "heteroaryl", as used herein, refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, fiiranyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The terms "alkylene", "cycloalkylene", "alkenylene", "alkynylene", and "arylene", as used herein, refer to bivalent groups obtained by removing a hydrogen atom from an alkyl, cycloalkyl, alkenyl, alkynyl, or aryl group, respectively. An alkylene group may be a $C_{1-18}$ alkylene group, a $C_{1-14}$ alkylene group, a $C_{1-10}$ alkylene group, a $C_{1-6}$ alkylene group or a $C_{1-4}$ alkylene group. Examples of $C_{1-6}$ alkylene groups are methylene, ethylene, propylene, butylene, pentylene and hexylene. A cycloalkylene group may be a $C_{3-10}$ cycloalkylene group, a $C_{3-8}$ cycloalkylene group or a $C_{3-6}$ cycloalkylene group. Examples of $C_{3-6}$ cycloalkylene groups include cyclopentylene and cyclohexylene. An alkenylene group may be a $C_{2-18}$ alkenylene group, a $C_{2-14}$ alkenylene group, a $C_{2-10}$ alkenylene group, a $C_{2-6}$ alkenylene group or a $C_{2-4}$ alkenylene group. Examples of a $C_{2-4}$ alkenylene group include ethenylene (vinylene), propenylene and butenylene. An alkynylene group may be a $C_{2-18}$ alkynylene group, a $C_{2-14}$ alkynylene group, a $C_{2-10}$ alkynylene group, a $C_{2-6}$ alkynylene group or a $C_{2-4}$ alkynylene group. Examples of a $C_{2-4}$ alkynylene group include ethynylene and propynylene. Examples of arylene groups include phenylene and a diradical derived from thiophene. For alkylene, cycloalkylene, alkenylene, alkynylene, and arylene, these groups may be bonded to other groups at any two positions on the group. Thus, propylene includes —CH$_2$CH$_2$CH$_2$— and —CH$_2$CH(CH$_3$)—, and phenylene includes ortho-, meta- and para-phenylene.

The term "substituted", as used herein in the context of substituted organic groups, refers to an organic group which bears one or more substituents selected from $C_{1-10}$ alkyl, aryl (as defined herein), cyano, amino, nitro, $C_{1-10}$ alkylamino, di($C_{1-10}$)alkylamino, arylamino, diarylamino, aryl($C_{1-10}$) alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "porous", as used herein, refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (J. Rouquerol et al., "Recommendations for the Characterization of Porous Solids", Pure & Appl. Chem., Vol. 66, No. 8, pp. 1739-1758, 1994). The following distinctions and definitions were adopted in previous IUPAC documents (K. S. W. Sing, et al, Pure and Appl. Chem., vol. 57, n04, pp 603-919, 1985; and IUPAC "Manual on Catalyst Characterization", J. Haber, Pure and Appl. Chem., vol. 63, pp. 1227-1246, 1991): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity", as used herein, therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer", as used herein, refers to a layer without mesoporosity or macroporosity. A compact layer may sometimes have microporosity or nanoporosity.

The term "semiconductor device", as used herein, refers to a device comprising a functional component which comprises a semiconductor material. This term may be understood to be synonymous with the term "semiconducting device". Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, or a light-emitting diode. The term "optoelectronic device", as used herein, refers to devices which source, control or detect light. Light is understood to include any electromagnetic radiation. Examples of optoelectronic devices include photovoltaic devices, photodiodes (including solar cells), phototransistors, photomultipliers, photoresistors, and light emitting diodes.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

The term "high vacuum", as used herein, refers to a vacuum regime characterised by pressures of between $10^{-8}$ mbar and $10^{-4}$ mbar. In contrast, the term "medium vacuum" refers to a vacuum regime characterised by pressures of between $10^{-4}$ mbar and 0.1 mbar, whilst the terms "low vacuum" and "rough vacuum" refer to a vacuum regime characterised by pressures of between 0.1 mbar and 1000 mbar.

The term "atmospheric pressure", as used herein, refers to the pressure generated by the gravitational attraction between the earth and its surrounding air. Atmospheric pressure at the surface of the earth is approximately 1000 mbar but varies, for instance, from 950 mbar to 1050 mbar.

Process for Producing a Layer of a Crystalline Material

The invention provides a process for producing a layer of a crystalline material, which process comprises:
 (i) exposing a substrate to a vapour comprising a first precursor compound in a first chamber to produce a layer of the first precursor compound on the substrate; and
 (ii) exposing the layer of the first precursor compound to a vapour comprising a second precursor compound in a second chamber to produce the layer of a crystalline material, wherein the pressure in the second chamber is greater than or equal to 1 mbar.

The invention also provides a process for producing a layer of a crystalline material that comprises a perovskite or a hexahalometallate, which process comprises:
 (i) exposing a substrate to a vapour comprising a first precursor compound in a first chamber to produce a layer of the first precursor compound on the substrate, wherein the first chamber is under a high vacuum; and
 (ii) exposing the layer of the first precursor compound to a vapour comprising a second precursor compound in a second chamber to produce the layer of a crystalline material, wherein the second chamber is not under a high vacuum.

In both processes, steps (i) and (ii) are usually performed sequentially. Thus, a layer of the first precursor compound is formed in step (i) and then step (ii) is performed. However, steps (i) and (ii) may overlap. For instance, the deposition of the first precursor compound may still be ongoing when the deposition of the second precursor compound begins. The first or second chamber may be evacuated before or after use to remove the vapour of the precursor compound. Further steps may be performed between steps (i) and (ii). As discussed below, the first and second chambers may be the same or different chambers. Thus, sometimes the first chamber and the second chamber are the same chamber (i.e. there is one chamber, and it is referred to as the first chamber during step (i) of the process and then referred to as the second chamber during part (ii) of the process). Alternatively, the first chamber and the second chamber may be different chambers. If the first and second chambers are different chambers, then the layer of the first precursor compound on the substrate is typically transferred from first chamber to the second chamber between steps (i) and (ii). Typically the first and the second chambers are different chambers. If the first and second chambers are different chambers then the process typically further comprises a step of transferring the substrate (or allowing the substrate to be transferred) between step (i) and step (ii). In this regard, it is preferable that the first and second chambers are different chambers as this avoids the need to evacuate and then re-pressurise the chambers between deposition steps.

In both processes, the second chamber is not under a high vacuum (i.e. the pressure in the second chamber is not less than $10^{-4}$ mbar). For instance, the pressure of the second chamber may be greater than or equal to 1 mbar. Preferably, the pressure in the second chamber is also less than atmospheric pressure. The pressure in the second chamber may therefore be less than 1000 mbar. Consequently, the pressure in the second chamber is greater than $10^{-4}$ mbar and may be less than 1000 mbar. In this regard, it is preferable that the pressure in the second chamber is above high vacuum and less than atmospheric pressure as this provides for better control over the deposition rate of the second precursor compound and therefore improved control over the crystal growth and its quality. In particular, when step (ii) involves exposing the layer of the first precursor compound to a non-directional vapour comprising the second precursor compound this control of the pressure in the second chamber, such that the pressure is above high vacuum and less than atmospheric pressure, allows for control of the partial pressure of the second precursor compound in the non-directional vapour, which will determine the deposition rate of the second precursor compound. The pressure of a chamber may be measured by any suitable means and is typically measured by a pressure gauge attached to the chamber. The pressure of the second chamber is preferably greater than the pressure of the second chamber (i.e. if the first chamber and the second chamber are the same, single chamber, the pressure of the chamber in step (ii) (i.e. the second chamber) is preferably greater than the pressure of the chamber in step (i) (i.e. the first chamber)).

Crystalline Material

The process of the invention may be used to produce a layer of any suitable crystalline material. Crystalline materials are those which can adopt one or more crystal structures. Crystalline materials therefore typically comprise crystals or crystallites having an ordered array of atoms or molecules.

The layer of a crystalline material is often a crystalline layer of a compound. Thus, the process of the invention is often a process for producing a crystalline layer of a compound. The compound may be any compound which can form a crystalline layer.

Often the crystalline material is a semiconducting material. The crystalline material (or crystalline layer of a compound) often has a band gap of equal to or less than 4.0 eV. Preferably, the crystalline material has a band gap of equal to or less than 3.0 eV. For instance, the crystalline material may have a band gap of from 0.1 eV to 4.0 eV, or from 0.5 eV to 3.5 eV. The crystalline material may have a band gap of from 1.0 eV to 3.0 eV.

The crystalline material may be a photoactive material. The crystalline material is typically a photoabsorbent material. The crystalline material is preferably capable of absorbing light having a wavelength of from 300 nm to 2000 nm.

The crystalline material present in the layer produced by the present invention typically comprises a compound comprising two or more different types of atoms, ions or molecules. The crystalline material may comprise a binary, tertiary or quaternary compound. Binary compounds are those which comprise two different types of atoms, molecules or ions. For instance a binary compound is a compound of formula $A_aB_b$, wherein A is an ion, atom or molecule, B is a different ion, atom or molecule and a and b are integers. Ternary compounds are those which comprise three different types of atoms, molecules or ions. For instance a ternary compound is a compound of formula $A_aB_bC_c$, wherein A is an ion, atom or molecule, B is a different ion, atom or molecule, C is another different ion, atom or molecule and a, b and c are integers. Quaternary compounds are those which comprise four different types of atoms, molecules or ions. For instance a quaternary compound is a compound of formula $A_aB_bC_cD_d$, wherein A is an ion, atom or molecule, B is a different ion, atom or molecule, C is another different ion, atom or molecule, D is yet another different ion, atom or molecule and a, b, c and d are integers. a, b, c and d are each typically from 1 to 6. In these definitions of binary, ternary and quaternary compounds, the ions may be atomic or molecular ions. The bonds between these different ions, atoms and molecules may be ionic or covalent or intermediate between ionic and covalent. Often, two or more ions which are very similar may be considered as the same type of ion. For instance, a ternary compound could comprise a first cation, a second cation and two or more halide anions, as the halide anions may be considered to be the same type of ion.

Typically, the crystalline material comprises greater than 90 wt % of a single compound.

Preferably, the crystalline material comprises greater than 95 wt % of a single compound. The single compound may be one of those as described herein.

Often the crystalline material comprises a ternary compound.

The crystalline material may comprise a compound with a formula which comprises one or more first cations, one or more second cations and one or more anions. Thus, the crystalline material may comprise a compound having a formula (I)

$$[A]_a[B]_b[C]_c \quad\quad\quad (I)$$

wherein [A] is one or more first cations, [B] is one or more second cations, [C] is one or more anions, a is an integer from 1 to 6, b is an integer from 1 to 6, and c is an integer from 1 to 18. a is often an integer from 1 to 3, b is often an integer from 1 to 3, and c is often an integer from 1 to 8.

[A] may be at least one monocation selected from any suitable monocations. [A] is typically at least one monocation selected from $Li^+$, $Na^+$, $K^+$, $Rb^+$, $Cs^+$, $NH_4^+$ and monovalent organic cations. Monovalent organic cations are singly positively charged organic cations, which may, for instance, have a molecular weight of no greater than 500 g/mol. For instance, [A] may be a single cation selected from $Li^+$, $Na^+$, $K^+$, $Rb^+$, $Cs^+$, $NH_4^+$ and monovalent organic cations. [A] is preferably at least one monocation selected from $Rb^+$, $Cs^+$, $NH_4^+$ and monovalent organic cations. For instance, [A] may be a single monocation selected from $Rb^+$, $Cs^+$, $NH_4^+$ and monovalent organic cations. In one embodiment, [A] may be at least one inorganic monocation selected from $Li^+$, $Na^+$, $K^+$, $Rb^+$, $Cs^+$ and $NH_4^+$. For instance, [A] may be a single inorganic monocation selected from $Li^+$, $Na^+$, $K^+$, $Rb^+$, $Cs^+$ and $NH_4^+$. In another embodiment, [A] may be at least one monovalent organic cation. For instance, [A] may be a single monovalent organic cation.

When [A] is at least one organic monocation, [A] is typically an organic monocation comprising an N atom. The N atom typically carries the positive charge (or part of the positive charge). Preferably, [A] is at least one monocation selected from $K^+$, $Rb^+$, $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. For instance, [A] may be a single monocation selected from $K^+$, $Rb^+$, $Cs^+$, $(NR^1R^2R^3R^4)+$, $(R^1R^2N=CR^3R^4)+$, $(R^1R^2N-C(R^5)=NR^3R^4)^+$ and $(R^1R^2N-C(NR^5R^6)=NR^3R^4)^+$, wherein each of $R^1$, $R^2$, $R^3$, R4, R5 and R6 is independently H, a substituted or unsubstituted $C_{1-20}$ alkyl group or a substituted or unsubstituted aryl group. $R^1$, $R^2$, $R^3$, $R^4$, $R^5$ and $R^6$ are typically independently H, a substituted or unsubstituted $C_{1-6}$ alkyl group or a substituted or unsubstituted aryl group. Preferably $R^1$, $R^2$, $R^3$, $R^4$, $R^5$ and $R^6$ are independently H, or an unsubstituted $C_{1-6}$ alkyl group. For instance, $R^1$, $R^2$, $R^3$, $R^4$, $R^5$ and $R^6$ may independently be H, methyl, ethyl or propyl.

Preferably, [A] is at least one monocation selected from $K^+$, $Rb^+$, $Cs^+$, $(R1NH3)^+$, $(NR_4^2)^+$, and $(H^2N-C(R^1)=NH^2)^+$, wherein $R^1$ is H, a substituted or unsubstituted $C_{1-20}$ alkyl group or a substituted or unsubstituted aryl group, and each $R^2$ is independently a substituted or unsubstituted $C_{1-10}$ alkyl group. More preferably, $R^1$ is H or an unsubstituted $C_{1-6}$ alkyl group and each $R^2$ is an unsubstituted $C_{1-6}$ alkyl group. For instance, $R^1$ may be H, methyl, ethyl or propyl and each $R^2$ may be methyl, ethyl and propyl. All $R^2$ may be the same and may be methyl, ethyl and propyl.

Thus, [A] may be at least one monocation selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$. Preferably [A] is at least one monocation selected from $Cs^+$, $NH_4^+$, $(CH_3NH_3)^+$, $(CH_3CH_2NH_3)^+$, $(N(CH_3)_4)^+$, $(H_2N-C(H)=NH_2)^+$ and $(H_2N-C(CH_3)$ =NH$_2$)$^+$. Preferably, [A] is a single type of cation, i.e. the compound is of formula A$_a$[B]$_b$[C]$_c$. [A] may be a single monocation selected from K$^+$, Rb$^+$, Cs$^+$, NH$_4^+$, (CH$_3$NH$_3$)$^+$, (CH$_3$CH$_2$NH$_3$)$^+$, (CH$_3$CH$_2$CH$_2$NH$_3$)$^+$, (N(CH$_3$)$_4$)$^+$, (N(CH$_2$CH$_3$)$_4$)$^+$, (N(CH$_2$CH$_2$CH$_3$)$_4$)$^+$, (H$_2$N—C(H)=NH$_2$)$^+$ and (H$_2$N—C(CH$_3$)=NH$_2$)$^+$.

Preferably, [A] is a single monocation selected from Cs$^+$, NH$_4^+$, (CH$_3$NH$_3$)$^+$, (CH$_3$CH$_2$NH$_3$)$^+$, (N(CH$_3$)$_4$)$^+$, (N(CH$_2$CH$_3$)$_4$)$^+$, (H$_2$N—C(H)=NH$_2$)$^+$ and (H$_2$N—C(CH$_3$)=NH$_2$)$^+$. In one embodiment, A is (CH$_3$NH$_3$)$^+$. In another embodiment, A is (H$_2$N—C(H)=NH$_2$)$^+$.

Often [B] is one or more metal or metalloid cations. Preferably [B] is one or more metal or metalloid dications or [B] is one or more metal or metalloid tetracations. Metals include elements of groups 3 to 12 of the Periodic Table of the Elements and Ga, In, Tl, Sn, Pb, Bi and Po. Metalloids include Si, Ge, As, Sb, and Te. For instance, [B] may be at least one metal or metalloid cation selected from Ti$^{4+}$, V$^{4+}$, Mn$^{4+}$, Fe$^{4+}$, Co$^{4+}$, Zr$^{4+}$, Nb$^{4+}$, Mo$^{4+}$, Ru$^{4+}$, Rh$^{4+}$, Pd$^{4+}$, Hf$^{4+}$, Ta$^{4+}$, W$^{4+}$, Re$^{4+}$, Os$^{4+}$, Ir$^{4+}$, Pt$^{4+}$, Sn$^{4+}$, Pb$^{4+}$, Po$^{4+}$, Si$^{4+}$, Ge$^{4+}$, Te$^{4+}$, Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Sn$^{2+}$, Yb$^{2+}$ and Eu$^{2+}$. Typically, [B] is at least one metal or metalloid cation selected from Pd$^{4+}$, W$^{4+}$, Re$^{4+}$, Os$^{4+}$, Ir$^{4+}$, Pt$^{4+}$, Sn$^{4+}$, Pb$^{4+}$, Ge$^{4+}$, Te$^{4+}$, Sn$^{2+}$, Pb$^{2+}$, Cu$^{2+}$, Ge$^{2+}$ and Ni$^{2+}$. For instance, [B] may be a single metal or metalloid cation selected from Pd$^{4+}$, W$^{4+}$, Re$^{4+}$, Os$^{4+}$, Ir$^{4+}$, Pt$^{4+}$, Sn$^{4+}$, Pb$^{4+}$, Ge$^{4+}$, Te$^{4+}$, Sn$^{2+}$, Pb$^{2+}$, Cu$^{2+}$, Ge$^{2+}$ and Ni$^{2+}$. Typically, [B] is at least one metal or metalloid cation selected from Sn$^{4+}$, Pb$^{4+}$, Sn$^{2+}$, Sn$^{4+}$, and Cu$^{2+}$.

[C] is typically one or more anions selected from halide anions and chalcogenide anions. [C] may therefore be one or more anions selected from F$^-$, Cl$^-$, Br$^-$, I$^-$, O$^{2-}$, Se$^{2-}$, and Te$^{2-}$. Often, [C] is one or more anions selected from Cl$^-$, Br$^-$, or I$^-$ or [C] is one or more anions selected from S$^{2-}$, Se$^{2-}$, and Te$^{2-}$.

The crystalline compound may therefore comprise a compound of formula (I)

[A]$_a$[B]$_b$[C]$_c$      (I)

wherein:
- [A] is one or more cations such as those described herein, for instance one or more organic monocations;
- [B] is one or more metal or metalloid cations selected from Pd$^{4+}$, W$^{4+}$, Re$^{4+}$, Os$^{4+}$, Ir$^{4+}$, Pt$^{4+}$, Sn$^{4+}$, Pb$^{4+}$, Ge$^{4+}$, Te$^{4+}$, Sn$^{2+}$, Pb$^{2+}$, Cu$^{2+}$, Ge$^{2+}$ and Ni$^{2+}$;
- [C] is one or more anions selected from F$^-$, Cl$^-$, Br$^-$, I$^-$, O$^{2-}$, S$^{2-}$, Se$^{2-}$, and Te$^{2-}$;
- a is an integer from 1 to 3;
- b is an integer from 1 to 3; and
- c is an integer from 1 to 8.

For instance, if [A] is one cation (A), [B] is two cations (B1 and B2), and [C] is one anion (C), the crystalline material comprises a compound of formula A$_a$(B$^1$,B$^2$)$_b$C$_c$. If [A], [B] or [C] is more than one ion, those ions may be present in any proportion. For instance, A$_a$(B$^1$,B$^2$)$_b$C$_c$ includes all compounds of formula A$_a$B$_{by}^1$B$_{b(1-y)}^2$C$_c$ wherein y is between 0 and 1, for instance from 0.05 to 0.95. Such materials may be referred to as mixed ion materials.

Typically, the crystalline material comprises a perovskite or a hexahalometallate. Preferably the crystalline material comprises a perovskite. The crystalline material often comprises a metal halide perovskite. The crystalline material often comprises an organometal halide perovskite.

The crystalline material may comprise a perovskite of formula (II):

[A][B][X]$_3$      (II)

wherein:
- [A] is at least one monocation;
- [B] is at least one metal cation, wherein [B] comprises at least one of Ca$^{2+}$, Sr$^{2+}$, Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Yb$^{2+}$ and Eu$^{2+}$; and
- [X] is at least one halide anion.

[A] may comprise at least one organic cation as described herein. For instance, [A] may comprise one or more organic cations selected from (NR$^1$R$^2$R$^3$R$^4$)$^+$, (R$^1$R$^2$N=CR$^3$R$^4$)$^+$, (R$^1$R$^2$N—C(R$^5$)=NR$^3$R$^4$)$^+$ and (R$^1$R$^2$N—C(NR$^5$R$^6$)=NR$^3$R$^4$)$^+$, wherein each of R$^1$, R$^2$, R$^3$, R$^4$, R$^5$ and R$^6$ is independently H, a substituted or unsubstituted C$_{1-20}$ alkyl group or a substituted or unsubstituted aryl group. R$^1$, R$^2$, R$^3$, R$^4$, R$^5$ and R$^6$ may be independently H, or an unsubstituted C$_{1-6}$ alkyl group. [A] may comprise one or more organic cations selected from (CH$_3$NH$_3$)$^+$, (CH$_3$CH$_2$NH$_3$)$^+$, (CH$_3$CH$_2$CH$_2$NH$_3$)$^+$, (N(CH$_3$)$_4$)$^+$, (H$_2$N—C(H)=NH$_2$)$^+$ and (H$_2$N—C(CH$_3$)=NH$_2$)$^+$. [A] may be a single cation selected from (CH$_3$NH$_3$)$^+$, (CH$_3$CH$_2$NH$_3$)$^+$, (CH$_3$CH$_2$CH$_2$NH$_3$)$^+$, (N(CH$_3$)$_4$)$^+$, (H$_2$N—C(H)=NH$_2$)$^+$ and (H$_2$N—C(CH$_3$)=NH$_2$)$^+$. A is often (CH$_3$NH$_3$)$^+$, (CH$_3$CH$_2$NH$_3$)$^+$ or (CH$_3$CH$_2$CH$_2$NH$_3$)$^+$.

[A] may comprise at least one inorganic cation. For instance, [A] may comprise one or more inorganic cations selected from Cs$^+$, Rb$^+$, Cu$^+$, Pd$^+$, Pt$^+$, Ag$^+$, Au$^+$, Rh$^+$, and Ru$^+$. [A] may comprise an inorganic cation selected from Cs$^+$ and Rb$^+$. Typically, [A] comprises one or more cations selected from (CH$_3$NH$_3$)$^+$, (H$_2$N—C(H)=NH$_2$)$^+$ and Cs$^+$.

The crystalline material may comprise a perovskite of formula (II):

[A][B][X]$_3$      (II)

wherein:
- [A] is at least one organic cation;
- [B] is at least one metal cation, wherein [B] comprises at least one of Ca$^{2+}$, Sr$^{2+}$Cd$^{2+}$, Cu$^{2+}$, Ni$^{2+}$, Mn$^{2+}$, Fe$^{2+}$, Co$^{2+}$, Pd$^{2+}$, Ge$^{2+}$, Sn$^{2+}$, Pb$^{2+}$, Yb$^{2+}$ and Eu$^{2+}$; and
- [X] is at least one halide anion.

Perovskite materials which may be formed by the process according to the invention are methylammonium lead iodide, methylammonium lead iodide chloride, methylammonium tin iodide, methylammonium tin iodide chloride, methylammonium lead bromide, formamidinium lead iodide, methylammonium copper bromide chloride, methylammonium copper chloride and ammonium copper bromide chloride.

The process of the invention allows layers of crystalline materials to be formed from low solubility precursor compounds, for instance copper precursor compounds. Thus, in one embodiment, the invention provides a perovskite comprising copper as described herein. The invention may provide a compound of formula ACuI$_3$, ACuBr$_3$, ACuCl$_3$, ACuF$_3$, ACuBrI$_2$, ACuBr$_x$I$_{3-x}$, ACuBr$_x$Cl$_{3-x}$, ACuF$_{3-x}$Br$_x$, ACuI$_x$Br$_{3-x}$, ACuICl$_{3-x}$, ACuF$_{3-x}$I$_x$, ACuCl$_x$Br$_{3-x}$, ACuI$_{3-x}$Cl$_x$, or ACuF$_{3-x}$Cl$_x$ where x is from 0 to 3, and wherein A is a monocation as described herein. For instance, the invention may provide a perovskite which is CH$_3$NH$_3$CuI$_3$, CH$_3$NH$_3$CuBr$_3$, CH$_3$NH$_3$CuCl$_3$, CH$_3$NH$_3$CuF$_3$, CH$_3$NH$_3$CuBrI$_2$, CH3NH3CuBr$_x$I$_{3-x}$, CH$_3$NH$_3$CuBr$_x$Cl$_{3-x}$, CH$_3$NH$_3$CuF$_{3-x}$Br$_x$, CH$_3$NH$_3$CuI$_x$Br3-x, CH$_3$NH$_3$CuI$_x$Cl$_{3-x}$,CH$_3$NH$_3$ CuF$_{3-x}$I$_x$, CH$_3$NH$_3$CuCl$_x$Br$_{3-x}$, CH$_3$NH$_3$CuI$_{3-x}$Cl$_x$, and CH$_3$NH$_3$CuF$_{3-x}$Cl$_x$ where x is from 0 to 3. x may be from 0.05 to 2.95.

In one embodiment, the perovskite is a perovskite compound of the formula (IIA):

AB[X]$_3$      (IIA)

wherein: A is a monocation; B is a metal cation; and [X] is two or more different halide anions. Preferably, [X] is two or three different halide anions. More preferably, [X] is two different halide anions. The monocation and metal cation may be as defined above. For instance, A may be an organic cation.

The crystalline material may, for instance, be a perovskite compound of formula (IIC):

$$ABX_{3-x}X'_x \qquad \text{(IIC)}$$

wherein: A is a monocation; B is a metal cation; X is a first halide anion; X' is a second halide anion which is different from the first halide anion; and x is from 0 to 3. Usually, x is from 0.05 to 0.95. For instance, x may be from 0.5 to 2.5, or from 0.75 to 2.25. Typically, x is from 1 to 2. A may be an organic cation.

Again, in formula (IIC), the monocations and metal cations may be as further defined hereinbefore. Thus the monocations may be selected from any organic cation or inorganic cation described above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. The metal cation may be selected from $Sn^{2+}$, $Pb^{2+}$, $Cu^{2+}$, $Ge^{2+}$ and $Ni^{2+}$. Preferably, the metal cation is $Sn^{2+}$, $Pb^{2+}$ or $Cu^{2+}$.

The crystalline material may comprise, or consist essentially of, a perovskite compound selected from $APbI_3$, $APbBr_3$, $APbCl_3$, $APbF_3$, $APbBr_xI_{3-x}$, $APbBr_xCl_{3-x}$, $APbI_xBr_{3-x}$, $APbI_xCl_{3-x}$, $APbCl_xBr_{3-x}$, $APbI_{3-x}Cl_x$, $ASnI_3$, $ASnBr_3$, $ASnCl_3$, $ASnF_3$, $ASnBrI_2$, $ASnBrxI_{3-x}$, $ASnBr_xCl_{3-x}$, $ASnF_{3-x}Br_{3-x}$, $ASnI_xBr_{3-x}$, $ASnI_xCl_{3-x}$, $ASnF_{3-x}I_x$, $ASnCl_xBr_{3-x}$, $ASnI_{3-x}Cl_x$ and $ASnF_{3-x}Cl_x$, $ACuI_3$, $ACuBr_3$, $ACuCl_3$, $ACuF_3$, $ACuBrI_2$, $ACuBr_xI_{3-x}$, $ACuBr_xCl_{3-x}$, $ACuF_{3-x}Br_x$, $ACuI_xBr_{3-x}$, $ACuI_xCl_{3-x}$, $ACuF_{3-x}I_x$, $ACuCl_xBr_{3-x}$, $ACuI_{3-x}Cl_x$, and $ACuF_{3-x}Cl_x$ where x is from 0 to 3, and wherein A is a monocation as described herein or an ammonium cation. x may be from 0.05 to 2.96. For instance, x may be from 0.1 to 2.9, or from 0.5 to 2.5. In some cases, x is from 0.75 to 2.25, or from 1 to 2. A may be an organic cation.

The crystalline material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_{3-x}Cl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$, and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH3NH3CuBr_xI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, and $CH_3NH_3CuF_{3-x}Cl_x$ where x is from 0 to 3. x may be from 0.05 to 2.95. For instance, x may be from 0.1 to 2.9, or from 0.5 to 2.5. In some cases, x is from 0.75 to 2.25, or from 1 to 2.

The crystalline material may comprise, or consist essentially of, a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbCl_2$, $CH_3NH_3PbIBr_2$, $CH_3NH_3PbICl_2$, $CH_3NH_3PbClBr_2$, $CH_3NH_3PbI_2Cl$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$.

The crystalline material may comprise, or consist essentially of, a perovskite compound selected from $CH_3NH_3PbBr_xI_{3-x}$, $CH_3NH_3PbBr_xCl_{3-x}$, $CH_3NH_3PbI_xBr_{3-x}$, $CH_3NH_3PbI_xCl_{3-x}$, $CH_3NH_3PbCl_xBr_{3-x}$, $CH_3NH_3PbI_{3-x}Cl_x$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$, and $CH_3NH_3SnF_{3-x}Cl_x$, where x is from 0.05 to 2.95. For instance, x may be from 0.5 to 2.5, from 0.75 to 2.25, or from 1 to 2.

The perovskite compound may be selected from $CH_3NH_3PbBrI_2$, $CH_3NH_3PbBrCl_2$, $CH_3NH_3PbIBr_2$, $CH_3NH_3PbICl_2$, $CH3NH_3SnF_2Br$, and $CH_3NH_3SnF_2I$. The perovskite may be $CH_3NH_3PbCl_2I$.

Preferably, the crystalline material comprises, or consists essentially of, a perovskite compound selected from $CH_3NH_3PbI_3$, $CH_3NH_3PbBr_3$, $CH_3NH_3PbCl_3$, $CH_3NH_3SnI_3$, $CH_3NH_3SnBr_3$, $CH_3NH_3SnCl_3$, $CH_3NH_3CuI_3$, $CH_3NH_3CuBr_3$, $CH_3NH_3CuCl_3$, $NH_4CuI_3$, $NH_4CuBr_3$, $NH_4CuCl_3$, $NH_4CuI_2Br$, $NH_4CuI_2Cl$, $NH_4CuBr_2Cl$, $NH_4CuCl_2Br$, $CH_3NH_3CuI_2Br$, $CH_3NH_3CuI_2Cl$, $CH_3NH_3CuBr_2Cl$, and $CH_3NH_3CuCl_2Br$. More preferably, the crystalline material comprises, or consist essentially of, a perovskite compound selected from $CH_3NH_3PbI_3$, $CH_3NH_3SnI_3$, $NH_4CuCl_2Br$, $CH_3NH_3CuCl_3$, and $CH_3NH_3CuCl_2Br$.

The crystalline material may for instance comprise, or consist essentially of, a perovskite compound selected from $(H_2N-C(H)=NH_2)PbI_3$, $(H_2N-C(H)=NH_2)PbBr_3$, $(H_2N-C(H)=NH_2)PbCl_3$, $(H_2N-C(H)=NH_2)SnI_3$, $(H_2N-C(H)=NH_2)SnBr_3$, $(H_2N-C(H)=NH_2)SnCl_3$, $(H_2N-C(H)=NH_2)CuI_3$, $(H_2N-C(H)=NH_2)CuBr_3$ and $(H_2N-C(H)=NH_2)CuCl_3$.

The crystalline material may comprise a hexahalometallate of formula (III):

$$[A]_2[M][X]_6 \qquad \text{(III)}$$

wherein:
[A] is at least one monocation;
[M] is at least one metal or metalloid tetracation; and
[X] is at least one halide anion.

[A] is at least one monocation; [M] is at least one metal or metalloid tetracation; and X is at least one halide anion. In a mixed monocation hexahalometallate, [A] is at least two monocations; [M] is at least one metal or metalloid tetracation (and typically [M] is a single metal or metalloid tetracation); and [X] is at least one halide anion (and typically [X] is a single halide anion). In a mixed metal hexahalometallate, [A] is at least one monocation (and typically [A] is a single monocation); [M] is at least two metal or metalloid tetracations (for instance $Ge^{4+}$ and $Se^{4+}$); and [X] is at least one halide anion (and typically [X] is a single halide anion). In a mixed halide hexahalometallate, [A] is at least one monocation (and typically [A] is a single monocation); [M] is at least one metal or metalloid tetracation (and typically [M] is a single metal tetra cation); and [X] is at least two halide anions, for instance $Br^-$ and $Cl^-$.

[A] may be at least one monocation selected from any suitable monocations, such as those described above for a organometal halide perovskite. [A] is typically at least one monocation selected from $Li^+$, $Na^+$, $K^+$, $Rb^+$, $Cs^+$, $NH_4^+$ and monovalent organic cations. Monovalent organic cations are singly positively charged organic cations, which may, for instance, have a molecular weight of no greater than 500 g/mol. For instance, [A] may be a single cation selected from $Li^+$, $Na^+$, $K^+$, $Rb^+$, $Cs^+$, $NH_4^+$ and monovalent organic cations. [A] is preferably at least one monocation selected from $Rb^+$, $Cs^+$, $NH_4^+$ and monovalent organic cations. For instance, [A] may be a single monocation selected from $Rb^+$, $Cs^+$, $NH_4^+$ and monovalent organic cations. In one embodiment, [A] may be at least one inorganic monocation selected from $Li^+$, $Na^+$, $K^+$, $Rb^+$, $Cs^+$ and $NH_4^+$. For instance, [A] may be a single inorganic monocation selected from $Li^+$, $Na^+$, $K^+$, $Rb^+$, $Cs^+$ and $NH_4^+$. In another embodiment, [A] may be at least one monovalent organic cation. For instance, [A] may be a single monovalent organic cation.

When [A] is at least one organic monocation, [A] is typically an organic monocation comprising an N atom. The N atom typically carries the positive charge (or part of the positive charge). Preferably, [A] is at least one monocation selected from $K^+$, $Rb^+$, $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. For instance, [A] may be a single monocation selected from $K^+$, $Rb^+$, $Cs^+$, $(NR^1R^2R^3R^4)^+$, $(R^1R^2N=CR^3R^4)^+$, $(R^1R^2N-C(R^5)=NR^3R^4)^+$ and $(R^1R^2N-C(NR^5R^6)=NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ are typically independently H, a substituted or unsubstituted $C_{1-6}$ alkyl group or a substituted or unsubstituted aryl group. Preferably $R^1$, $R^2$, $R^3$, $R^4$, $R^5$ and $R^6$ are independently H, or an unsubstituted $C_{1-6}$ alkyl group. For instance, $R^1$, $R^2$, $R^3$, $R^4$, $R^5$ and $R^6$ may independently be H, methyl, ethyl or propyl.

Preferably, [A] is at least one monocation selected from $K^+$, $Rb^+$, $Cs^+$, $(R^1NH_3)^+$, $(NR^2_4)^+$, and $(H_2N-C(R^1)=NH_2)^+$, wherein $R^1$ is H, a substituted or unsubstituted $C_{1-20}$ alkyl group or a substituted or unsubstituted aryl group, and each $R^2$ is independently a substituted or unsubstituted $C_{1-10}$ alkyl group. More preferably, $R^1$ is H or an unsubstituted $C_{1-6}$ alkyl group and each $R^2$ is an unsubstituted $C_{1-6}$ alkyl group. For instance, $R^1$ may be H, methyl, ethyl or propyl and each $R^2$ may be methyl, ethyl and propyl. All $R^2$ may be the same and may be methyl, ethyl and propyl.

Thus, [A] may be at least one monocation selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$. Preferably [A] is at least one monocation selected from $Cs^+$, $NH_4^+$, $(CH_3NH_3)^+$, $(CH_3CH_2NH_3)^+$, $(N(CH_3)_4)^+$, $(H_2N-C(H)=NH_2)^+$ and $(H_2N-C(CH_3)=NH_2)^+$.

Preferably, [A] is a single type of cation, i.e. the hexahalometallate is a compound of formula $A_2[M][X]_6$. [A] may be a single monocation selected from $K^+$, $Rb^+$, $Cs^+$, $NH_4^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N-C(H)=NH_2)^+$ and $(H_2N-C(CH_3)=NH_2)^+$. Preferably, [A] is a single monocation selected from $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N-C(H)=NH_2)^+$ and $(H_2N-C(CH_3)=NH_2)^+$. In one embodiment, [A] is $(CH_3NH_3)^+$. In another embodiment, [A] is $(H_2N-C(H)=NH_2)^+$.

[M] may be any suitable metal or metalloid tetracation. Metals include elements of groups 3 to 12 of the Periodic Table of the Elements and Ga, In, Tl, Sn, Pb, Bi and Po. Metalloids include Si, Ge, As, Sb, and Te. For instance, [M] may be at least one metal or metalloid tetracation selected from $Ti^{4+}$, $V^{4+}$, $Mn^{4+}$, $Fe^{4+}$, $Co^{4+}$, $Zr^{4+}$, $Nb^{4+}$, $Mo^{4+}$, $Ru^{4+}$, $Rh^{4+}$, $Pd^{4+}$, $Hf^{4+}$, $Ta^{4+}$, $W^{4+}$, $Re^{4+}$, $Os^{4+}$, $Ir^{4+}$, $Pt^{4+}$, $Sn^{4+}$, $Pb^{4+}$, $Po^{4+}$, $Si^{4+}$, $Ge^{4+}$, and $Te^{4+}$. Typically, [M] is at least one metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$. For instance, [M] may be a single metal or metalloid tetracation selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$.

Typically, [M] is at least one metal or metalloid tetracation selected from $Sn^{4+}$, $Te^{4+}$, $Ge^{4+}$, and $Re^{4+}$. In one embodiment [M] is at least one metal or metalloid tetracation selected from $Pb^{4+}$, $Sn^{4+}$, $Te^{4+}$, $Ge^{4+}$ and $Re^{4+}$. For instance, [M] may be at least one metal or metalloid tetracation selected from $Pb^{4+}$, $Sn^{4+}$, $Te^{4+}$ and $Ge^{4+}$. Preferably, [M] is at least one metal or metalloid tetracation selected from $Sn^{4+}$, $Te^+$, and $Ge^{4+}$. As discussed above, the hexahalometallate compound may be a mixed-metal or a single-metal hexahalometallate. Preferably, the hexahalometallate compound is a single-metal hexahalometallate compound. More preferably, [M] is a single metal or metalloid tetracation selected from $Sn^{4+}$, $Te^{4+}$, and $Ge^{4+}$. For instance, [M] may be a single metal or metalloid tetracation which is $Te^{4+}$. For instance, [M] may be a single metal or metalloid tetracation which is $Ge^{4+}$. Most preferably, [M] is a single metal or metalloid tetracation which is $Sn^{4+}$.

[X] is at least one halide anion. [X] is therefore at least one halide anion selected from $F^-$, $Cl^-$, $Br^-$ and $I^-$. Typically, [X] is at least one halide anion selected from $Cl^-$, $Br^-$ and $I^-$. The hexahalometallate compound may be a mixed-halide hexahalometallate or a single-halide hexahalometallate. If the hexahalometallate is mixed, [X] is two, three or four halide anions selected from $F^-$, $Cl^-$, $Br^-$ and $I^-$. Typically, in a mixed-halide compound, [X] is two halide anions selected from $F^-$, $Cl^-$, $Br^-$ and $I^-$.

Typically, [A] is a single monocation and [M] is a single metal or metalloid tetracation. Thus, the crystalline material may, for instance, comprise a hexahalometallate compound of formula (IIIA)

$$A_2M[X]_6 \quad \text{(IIIA)}$$

wherein: A is a monocation; M is a metal or metalloid tetracation; and [X] is at least one halide anion. [X] may be one, two or three halide anions selected from $F^-$, $Cl^-$, $Br^-$ and $I^-$, and preferably selected from $Cl^-$, $Br^-$ and $I^-$. In formula (IIIA), [X] is preferably one or two halide anions selected from $Cl^-$, $Br^-$ and $I^-$.

The crystalline material may, for instance, comprise a hexahalometallate compound of formula (IIIB)

$$A_2MX_{6-y}X'_y \quad \text{(IIIB)}$$

wherein: A is a monocation; M is a metal or metalloid tetracation; X and X' are each independently a (different) halide anion; and y is from 0 to 6. When y is 0 or 6, the hexahalometallate compound is a single-halide compound. When y is from 0.01 to 5.99 the compound is a mixed-halide hexahalometallate compound. When the compound is a mixed-halide compound, y may be from 0.05 to 5.95. For instance, y may be from 1.00 to 5.00.

The hexahalometallate compound may, for instance, be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, $A_2SnBr_{6-y}I_y$, $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, $A_2TeBr_{6-y}I_y$, $A_2GeF_{6-y}Cl_y$, $A_2GeF_{6-y}Br_y$, $A_2GeF_{6-y}I_y$, $A_2GeCl_6/Br_y$, $A_2GeCl_{6-y}I_y$, $A_2GeBr_{6-y}I_y$, $A_2ReF_{6-y}Cl_y$, $A_2ReF_{6-y}Br_y$, $A_2ReF_{6-y}I_y$, $A_2ReCl_{6-y}Br_y$, $A_2ReCl_{6-y}I_y$ or $A_2ReBr_{6-y}I_y$, wherein: A is $K^+$, $Rb^+$, $Cs^+$, $(R^1NH_3)^+$, $(NR^2_4)^+$, or $(H_2N-$ $C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0 to 6. Optionally, y is from 0.01 to 5.99. If the hexahalometallate compound is a mixed-halide compound, y is typically from 1.00 to 5.00. A may be as defined above. For instance, A may be $Cs^+$, $NH_4^+$, $(CH_3NH_3)^+$, $(CH_3CH_2NH_3)^+$, $(N(CH_3)_4)^+$, $(N(CH_2CH_3)_4)^+$, $(H_2N-C(H)=NH_2)^+$ or $(H_2N-C(CH_3)=NH_2)^+$, for instance $Cs^+$, $NH_4^+$, or $(CH_3NH_3)^+$.

The hexahalometallate compound may typically be $A_2SnF_{6-y}Cl_y$, $A_2SnF_{6-y}Br_y$, $A_2SnF_{6-y}I_y$, $A_2SnCl_{6-y}Br_y$, $A_2SnCl_{6-y}I_y$, or $A_2SnBr_{6-y}I_y$, wherein: A is $K^+$, $Rb^+$, $Cs^+$, $(R^1NH_3)^+$, $(NR^2{}_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

In another embodiment, the hexahalometallate compound is $A_2GeF_{6-y}Cl_y$, $A_2GeF_{6-y}Br_y$, $A_2GeF_{6-y}I_y$, $A_2GeCl_{6-y}Br_y$, $A_2GeCl_{6-y}I_y$, or $A_2GeBr_{6-y}I_y$, wherein: A is $K^+$, $Rb^+$, $Cs^+$, $(R^1NH_3)^+$, $(NR^2{}_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

The hexahalometallate compound may, for instance, be $A_2TeF_{6-y}Cl_y$, $A_2TeF_{6-y}Br_y$, $A_2TeF_{6-y}I_y$, $A_2TeCl_{6-y}Br_y$, $A_2TeCl_{6-y}I_y$, or $A_2TeBr_{6-y}I_y$, wherein: A is $K^+$, $Rb^+$, $Cs^+$, $(R^1NH_3)^+$, $(NR^2{}_4)^+$, or $(H_2N-C(R^1)=NH_2)^+$, or A is as defined herein, wherein $R^1$ is H, a substituted or unsubstituted $C_{1-20}$ alkyl group or a substituted or unsubstituted aryl group, or $R^1$ is as defined herein, and $R^2$ is a substituted or unsubstituted $C_{1-10}$ alkyl group, or $R^2$ is as defined herein; and y is from 0 to 6 or y is as defined herein.

Often, y will be from 1.50 to 2.50. For instance, y may be from 1.80 to 2.20. This may occur if the compound is produced using two equivalents of AX' and one equivalent of $MX_4$, as discussed below.

In some embodiments, all of the ions are single anions. Thus, the crystalline material may comprise a hexahalometallate compound of formula (IV)

$$A_2MX_6 \qquad (IV)$$

wherein: A is a monocation; M is a metal or metalloid tetracation; and X is a halide anion. A, M and X may be as defined herein.

The hexahalometallate compound may be $A_2SnF_6$, $A_2SnCl_6$, $A_2SnBr_6$, $A_2SnI_6$, $A_2TeF_6$, $A_2TeCl_6$, $A_2TeBr_6$, $A_2TeI_6$, $A_2GeF_6$, $A_2GeCl_6$, $A_2GeBr_6$, $A_2GeI_6$, $A_2ReF_6$, $A_2ReCl_6$, $A_2ReBr_6$ or $A_2ReI_6$, wherein: A is $K^+$, $Rb^+$, $Cs^+$, $(R^1NH_3)^+$, $(NR^2{}_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group. A may be as defined herein.

Preferably, the hexahalometallate compound is $A_2SnI_6$, $A_2SnBr_6$, $A_2SnBr_{6-y}I_y$, $A_2SnCl_{6-y}I_y$, or $A_2SnCl_{6-y}Br_y$ wherein: A is $K^+$, $Rb^+$, $Cs^+$, $(R^1NH_3)^+$, $(NR^2{}_4)^+$, or $(H_2N-C(R^1)=NH_2)^+$, wherein $R^1$ is H, a substituted or unsubstituted $C_{1-20}$ alkyl group or a substituted or unsubstituted aryl group, and $R^2$ is a substituted or unsubstituted $C_{1-10}$ alkyl group; and y is from 0.01 to 5.99. A and y may be as defined herein.

More preferably, the hexahalometallate compound is $Cs_2SnI_6$, $Cs_2SnBr_6$, $Cs_2SnBr_{6-y}I_y$, $Cs_2SnCl_{6-y}I_y$, $Cs_2SnCl_{6-y}Br_y$, $(CH_3NH_3)_2SnI_6$, $(CH_3NH_3)_2SnBr_6$, $(CH_3NH_3)_2SnBr_{6-y}I_y$, $(CH_3NH_3)_2SnCl_{6-y}I_y$, $(CH_3NH_3)_2SnCl_{6-y}Br_y$, $(H_2N-C(H)=NH_2)_2SnI_6$, $(H_2N-C(H)=NH_2)_2SnBr_6$, $(H_2N-C(H)=NH_2)_2SnBr_{6-y}I_y$, $(H_2N-C(H)=NH_2)_2SnCl_{6-y}I_y$, or $(H_2N-C(H)=NH_2)_2SnCl_{6-y}Br_y$, wherein y is from 0.01 to 5.99. y may be as defined herein. For example, the hexahalometallate compound may be $(CH_3NH_3)_2SnI_6$, $(CH_3NH_3)_2SnBr_6$, $(CH_3NH_3)_2SnCl_6$, $(H_2N-C(H)=NH_2)_2SnI_6$, $(H_2N-C(H)=NH_2)_2SnBr_6$ or $(H_2N-C(H)=NH_2)_2SnCl_6$. The hexahalometallate compound may be $Cs_2SnI_6$, $Cs_2SnBr_6$, $Cs_2SnCl_{6-y}Br_y$, $(CH_3NH_3)_2SnI_6$, $(CH_3NH_3)_2SnBr_6$, or $(H_2N-C(H)=NH_2)_2SnI_6$.

Conditions

In the processes of the invention, the second chamber is not under a high vacuum (i.e. the pressure in the second chamber is not less than $10^{-4}$ mbar). The pressure in the second chamber is therefore greater than 10' mbar, for instance, the pressure of the second chamber may be greater than or equal to 1 mbar. The pressure in the second chamber means that step (ii) is not typically a vacuum deposition.

In one embodiment, the pressure in the second chamber may be greater than or equal to 100 mbar. Preferably, the pressure in the second chamber is greater than or equal to 500 mbar. The second chamber is often at atmospheric pressure. Thus, the pressure in the second chamber may be from 900 mbar to 1100 mbar, for instance from 950 mbar to 1050 mbar.

In a further embodiment, the pressure in the second chamber is above high vacuum and is also less than atmospheric pressure. The pressure in the second chamber may therefore be less than 1000 mbar. Consequently, the pressure in the second chamber is greater than $10^{-4}$ mbar and may be less than 1000 mbar.

The second chamber comprises a vapour comprising the second precursor compound during the production of the layer of the crystalline compound. The second chamber may comprise a carrier case, for instance an inert gas such as nitrogen, air, helium, neon, argon or krypton. The second chamber often contains nitrogen or air.

The pressure in the first chamber is typically less than or equal to $10^{-2}$ mbar. Often, the pressure in the first chamber is less than or equal to $10^{-3}$ mbar. The pressure in the first chamber is therefore often at least a rough vacuum. Preferably, the pressure in the first chamber is less than or equal to $10^{-4}$ mbar. For instance, the pressure in the first chamber may be less than or equal to $10^{-5}$ mbar. Therefore, the first chamber is preferably under a high vacuum.

The pressure in the second chamber is higher than the pressure in the first chamber. For instance, the pressure in the first chamber may be less than or equal to $10^{-3}$ mbar and the pressure in the second chamber is greater than or equal to 100 mbar.

If the first chamber is under a high vacuum (for instance, less than or equal to $10^{-4}$ mbar) or, for instance, a pressure of less than or equal to $10^{-3}$ mbar, step (i) typically comprises vacuum deposition of the first precursor compound. As the pressure in the second chamber is above high vacuum (for instance greater than $10^{-4}$ mbar or greater than or equal to 1 mbar), step (ii) typically comprises exposing the layer of the first precursor compound to a vapour comprising the second precursor compound at a pressure of greater than $10^{-4}$ mbar (e.g. greater than or equal to 1 mbar).

Thus, in a first embodiment the process of the invention may comprise:

(i) producing a layer of a first precursor compound on a substrate by vacuum deposition with a vapour comprising the first precursor compound; and (ii) exposing the layer of the first precursor compound to a vapour of the second precursor compound at a pressure of greater than or equal to 1 mbar, for instance greater than or equal to 500 mbar.

In a second embodiment the process of the invention may comprise:

(i) exposing a substrate to a vapour comprising a first precursor compound in a first chamber to produce a layer of the first precursor compound on the substrate, wherein the first chamber is under a high vacuum; and (ii) exposing the layer of the first precursor compound to a vapour comprising a second precursor compound in a second chamber to produce the layer of a crystalline material, wherein the second chamber is not under a high vacuum.

In both processes, the vapour comprising the first precursor compound is typically produced by heating a composition comprising (or consisting essentially of) the first precursor compound. The composition comprising the first precursor compound is typically heating in a vessel such as a crucible (which is the source of the vapour). The vapour produced by heating the first precursor compound travels to the substrate, which is often placed above the heated composition, and condenses on the substrate to form a layer of the first precursor compound. The composition comprising, or consisting essentially of, the first precursor compound is typically heated at a temperature of from 50° C. to 250° C., for instance from 50° C. to 150° C. or from 150° C. to 250° C. The substrate is usually placed from 1 cm to 20 cm (for instance form 5 cm to 10 cm) away from the source of the vapour of the first precursor compound.

The rate of disposition of the first precursor compound is often from 0.05 to 1.0 nm/s, for instance from 0.1 to 0.5 nm/s. The substrate is often exposed to the vapour comprising the first precursor compound for from 1 minute to 1 hour, for instance from 10 minutes to 30 minutes.

Step (i) is continued until a layer of the first precursor compound of desired thickness is formed on the substrate. For instance, the substrate may be exposed to the vapour comprising the first precursor compound until a layer of the first precursor compound having a thickness of from 10 nm to 1 µm, for instance from 100 nm to 500 nm is formed. Often, the layer of the first precursor compound has a thickness of greater than or equal to 100 nm. Preferably, exposure is continued until a layer having a thickness of from 200 nm to 300 nm is formed.

Step (ii) comprises exposing the layer of the first precursor compound to a vapour comprising a second precursor compound in a second chamber to produce the layer of a crystalline material, wherein the second chamber is not under a high vacuum, step (ii) is not a vacuum deposition process. Step (ii) may comprise: annealing (i.e. heating) the layer of the first precursor compound on the substrate in an atmosphere comprising a vapour comprising a second precursor compound to produce the layer of a crystalline material.

Typically, the second chamber is a sealed chamber comprising: the substrate with the layer of the first precursor compound disposed thereon; a solid composition comprising, or consisting essentially of the second precursor compound; the vapour comprising the second precursor compound; and optionally a carrier gas, for instance air or nitrogen. The second chamber may further comprise a solvent such that the solvent annealing step described below occurs simultaneously with step (ii).

The process typically further comprises producing the vapour comprising a second precursor compound by heating the second precursor compound in the second chamber. The second chamber may be a sealed chamber comprising the layer of the first precursor compound on a substrate and a solid composition comprising, or consisting essentially of, the second precursor compound. The solid composition comprising, or consisting essentially of, the second precursor compound may be placed in a crucible which is heated, or it may be placed directly on an interior surface of the second chamber, for instance on the floor of the second chamber, and the second chamber may then be heated. The second chamber may be placed on a hot plate. Upon heating the second chamber, the second precursor compound may sublime to form a vapour comprising the second precursor compound which fills the second chamber. The layer of the first precursor compound is then exposed to the vapour comprising the second precursor compound (for instance as an atmosphere of the vapour) which allows the formation of the layer of the crystalline material.

The layer of the first precursor compound is typically exposed to a vapour comprising the second precursor compound in the second chamber to produce the layer of a crystalline material for from 10 minutes to 12 hours or from 30 minutes to 6 hours. The layer of the first precursor compound is exposed to a vapour comprising a second precursor compound for a time sufficient to allow formation of the layer of the crystalline material. The layer of the first precursor compound is typically exposed to a vapour comprising a second precursor compound for from 1 to 4 hours, for instance from 1.5 to 2.5 hours.

Typically, the first chamber and the second chamber are different chambers, i.e. they are unconnected chambers. The substrate comprising the layer of the first precursor compound is therefore often transported from the first chamber to the second chamber following step (i). The substrate comprising the layer of the first precursor compound is therefore often transported through air to the second chamber.

Thus, a typical process according to the invention may comprise:

(a) placing a substrate within a first chamber comprising a composition comprising, or consisting essentially of, the first precursor compound and evacuating the first chamber such that the pressure is less than or equal to $10^{-4}$ mbar (or another pressure as described herein for the first chamber);

(b) heating the composition comprising, or consisting essentially of, the first precursor compound to produce a vapour comprising the first precursor compound and exposing the substrate to the vapour comprising the first precursor compound in the first chamber to produce a layer of the first precursor compound on the substrate;

(c) transferring the layer of the first precursor compound on the substrate from the first chamber to a second chamber (or allowing it to be transferred) at greater than $10^{-4}$ mbar (for instance at greater than or equal to 1 mbar, for instance at greater than or equal to 500 mbar or at atmospheric pressure) which comprises a composition comprising, or consisting essentially of, a second precursor compound;

(d) heating the composition comprising, or consisting essentially of, the second precursor compound to produce a vapour comprising the second precursor compound at a pressure of greater than $10^{-4}$ mbar (for instance at greater than or equal to 1 mbar, for instance at greater than or equal to 500 mbar or at atmospheric pressure); and (e) exposing the layer of the first precursor compound to the vapour comprising the second precursor compound (e.g. an atmosphere of the vapour) in a second chamber (optionally for a time of from 30 minutes to 6 hours) to produce the layer of a crystalline material, wherein the pressure in the second chamber is greater than $10^{-4}$ mbar (or at greater than or equal to 1 mbar, for instance at greater than or equal to 500 mbar or at atmospheric pressure).

In some embodiments, the first chamber and the second chamber are the same chamber. Thus, there is one chamber which is referred to as the first chamber during step (i) and which is then referred to as the second chamber during step (ii). In such an arrangement, the pressure in the single chamber is typically increased between step (i) and step (ii). For instance, the chamber may be evacuated (to lower the pressure) to act as the first chamber for step (i), before a carrier gas or the vapour comprising the second precursor compound is introduced into the chamber to increase the pressure such that the chamber acts as the second chamber during step (ii).

Often, step (i) comprises vacuum deposition of the first compound (for instance in a first chamber at a pressure of less than or equal to $10^{-4}$ mbar) and step (ii) comprises annealing or heating the layer of the first precursor compound in vapour comprising the second precursor compound at a pressure of greater than $10^{-4}$ mbar (for instance greater than or equal to 1 mbar). Vacuum deposition is typically a directional deposition whereby molecules of the compound being deposited travel in a straight or substantially straight line to the substrate. Thus vacuum deposition requires a low pressure to prevent collision of the molecules of the compound being disposed with other molecules or particles in the atmosphere. In contrast, step (ii) comprises exposing the layer of the first precursor compound to a vapour comprising a second precursor compound in a second chamber to produce the layer of a crystalline material, wherein the pressure in the second chamber is greater than $10^{-4}$ mbar (for instance greater than or equal to 1 mbar). High vacuum is considered to be where the mean free path of a gas or vapour is longer than the size of the chamber, such that there are very few collisions between molecules or particles in the vapour/gas (i.e. molecular flow). At pressures above high vacuum (e.g. at greater than or equal to 1 mbar) molecules of the second precursor compound typically collide frequently with other gaseous molecules or particles in the second chamber. The layer of the first precursor compound is therefore exposed to a non-directional vapour comprising the second precursor compound. This is thought to improve formation of the layer of the crystalline material.

The crystalline material is formed by reaction between the layer of the first precursor compound and vapour comprising the second precursor compound.

Typically, the mean free path of the vapour of the first precursor compound is greater than or equal to 10 nm or the mean free path of the vapour of the second precursor compound is less than or equal to 0.1 mm. For instance, the mean free path of the vapour of the first precursor compound may be greater than or equal to 10 mm and the mean free path of the vapour of the second precursor compound may be less than or equal to 0.1 mm. Often, the mean free path of the vapour of the first precursor compound is greater than or equal to 100 mm or the mean free path of the vapour of the second precursor compound is less than or equal to 1 µm. The mean free path of a vapour may be calculated based on, for instance, temperature and pressure.

The temperature of the second chamber is often greater than or equal to 50° C. or greater than or equal to 100° C. The temperature is typically sufficient to allow some of the second precursor compound to sublime. For instance, temperature of the second chamber may be from 100° C. to 500° C. Preferably, the temperature of the second chamber may be from 100° C. to 250° C. The temperature of the walls of the second chamber is typically greater than the temperature of the substrate, as this can prevent deposition of the second precursor compound on the walls of the second chamber. In some cases, the temperature of the second chamber is less than or equal to 150° C.

Precursor Compounds

The first and second precursor compounds may be any suitable precursor compounds for formation of the crystalline material. Additional precursor compounds may be present in either step (i) or step (ii).

Typically (i) the first precursor compound comprises one or more first cations and one or more first anions and (ii) the second precursor compound comprises one or more second cations and one or more second anions.

The one or more first cations are typically selected from metal cations. Metal cations include any cation of metals in groups 1 to 14 of the periodic table. The one or more first cations are often one or more metal monocations, one or more metal dications, or one or more metal tetracations. Preferably, the one or more first cations are one or more metal dications or one or more metal tetracations. Often, the one or more first cations are a single type of metal cation, for instance a single metal dication or a single metal tetracation. If the crystalline material comprises a perovskite, the one or more first cations typically comprise one or more metal dications. If the crystalline material comprises a hexahalometallate, the one or more first cations typically comprise one or more metal tetracations.

The one or more first anions are typically selected from halide anions and chalcogenide anions. The one or more first anions are often selected from halide anions. The one or more first anions are often a single type of halide anion.

The one or more second cations are typically selected from metal cations, ammonium and organic cations. The one or more second cations are typically one or more monocations.

The one or more second anions are typically selected from halide anions and chalcogenide anions. The one or more second anions are often selected from halide anions. The one or more second anions are often a single type of halide anion.

Typically (i) the first precursor compound comprises a metal cation and one or more first anions and (ii) the second precursor compound comprises an inorganic cation (e.g. a caesium cation ($Cs^+$), an ammonium cation ($NH^{4+}$) or an organic cation and one or more second anions.

Typically, the metal cation is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, or $Te^{4+}$; the one or more first anions are selected from halide anions; the inorganic cation is a caesium cation or a rubidium cation; the organic cation is an organic ammonium cation or an organic formamidinium cation; and the one or more second anions are selected from halide anions.

The organic cation may be any organic cation as described above. For instance, the organic cation may be selected from $(NR^1R^2R^3R^4)^+$, $(R^1R^2N=CR^3R^4)^+$, $(R^1R^2N-C(R^5)$ =NR$^3$R$^4$)$^+$ and (R$^1$R$^2$N—C(NR$^5$R$^6$)=NR$^3$R$^4$)$^+$, wherein each of R$^1$, R$^2$, R$^3$, R$^4$, R$^5$ and R$^6$ is independently H, a substituted or unsubstituted C$_{1-20}$ alkyl group or a substituted or unsubstituted aryl group. R$^1$, R$^2$, R$^3$, R$^4$, R$^5$ and R$^6$ are typically independently H, a substituted or unsubstituted C$_{1-6}$ alkyl group or a substituted or unsubstituted aryl group. Preferably R$^1$, R$^2$, R$^3$, R$^4$, R$^5$ and R$^6$ are independently H, or an unsubstituted C$_{1-6}$ alkyl group. For instance, R$^1$, R$^2$, R$^3$, R$^4$, R$^5$ and R$^6$ may independently be H, methyl, ethyl or propyl.

Preferably, the organic cation is selected from (R$^1$NH$_3$)$^+$, (NR$^2_4$)$^+$, and (H$_2$N—C(R$^1$)=NH$_2$)$^+$, wherein R$^1$ is H, a substituted or unsubstituted C$_{1-20}$ alkyl group or a substituted or unsubstituted aryl group, and each R$^2$ is independently a substituted or unsubstituted C$_{1-10}$ alkyl group. More preferably, R$^1$ is H or an unsubstituted C$_{1-6}$ alkyl group and each R$^2$ is an unsubstituted C$_{1-6}$ alkyl group. For instance, R$^1$ may be H, methyl, ethyl or propyl and each R$^2$ may be methyl, ethyl and propyl. All R$^2$ may be the same and may be methyl, ethyl and propyl. For instance, the organic cation may be selected from (CH$_3$NH$_3$)$^+$, (CH$_3$CH$_2$NH$_3$)$^+$, (CH$_3$CH$_2$CH$_2$NH$_3$)$^+$, (N(CH$_3$)$_4$)$^+$, (N(CH$_2$CH$_3$)$_4$)$^+$, (N(CH$_2$CH$_2$CH$_3$)$_4$)$^+$, (H$_2$N—C(H)=NH$_2$)$^+$ and (H$_2$N—C(CH$_3$)=NH$_2$)$^+$.

Often, the metal cation is Cu$^{2+}$, Ge$^{2+}$, Sn$^{2+}$, Pb$^{2+}$; the one or more first anions are selected from F$^-$, Cl$^-$, Br$^-$ and I$^-$; the organic cation is a cation of formula (R$^5$NH$_3$)$^+$ wherein R$^5$ is a unsubstituted or substituted C$_{1-20}$ alkyl group or an unsubstituted or substituted aryl group; or the one or more second anions are selected from F$^-$, Cl$^-$, Br$^-$ and I$^-$. For instance, the metal cation may be Cu$^{2+}$, Ge$^{2+}$, Sn$^{2+}$, Pb$^{2+}$; the one or more first anions may be selected from r, Cl$^-$, Br$^-$ and I$^-$ the organic cation may be a cation of formula (R$^5$NH$^3$)$^+$ wherein R$^5$ is a unsubstituted or substituted C$_{1-20}$ alkyl group or an unsubstituted or substituted aryl group; and the one or more second anions may be selected from F$^-$, Cl$^-$, Br$^-$ and I$^-$.

If the metal cation is a dication, the crystalline material is often a perovskite, such as that described by formula (II) above. If the metal cation is a tetracation, the crystalline material is often a hexahalometallate as describe by formula (III) above.

If the crystalline material is a perovskite, the first precursor compound is often a metal dihalide and the second precursor compound is often a halide of an organic cation. If the crystalline material is a hexahalometallate, the first precursor compound is often a metal tetrahalide and the second precursor compound is often a halide of an organic cation.

The first precursor compound may be a compound of formula BX$_2$ wherein B is a metal cation and X is a halide anion; and/or the second precursor compound may be a compound of formula AX' wherein A is a monocation (for instance an organic cation) and X' is a halide anion. In some cases, X and X' are different halide anions. This is typically the case for perovskites.

The first precursor compound may, for instance, be selected from lead difluoride, lead dichloride, lead dibromide, lead diiodide, tin difluoride, tin dichloride, tin dibromide, tin diiodide, copper difluoride, copper dichloride, copper dibromide, copper diiodide, germanium difluoride, germanium dichloride, germanium dibromide, germanium diiodide, lead tetrafluoride, lead tetrachloride, lead tetrabromide, lead tetraiodide, tin tetrafluoride, tin tetrachloride, tin tetrabromide, tin tetraiodide, germanium tetrafluoride, germanium tetrachloride, germanium tetrabromide, and germanium tetraiodide. The first precursor compound may be selected from lead dichloride, lead dibromide, lead diiodide, tin dichloride, tin dibromide, tin diiodide, copper dichloride, copper dibromide, copper diiodide, germanium dichloride, germanium dibromide, germanium diiodide, lead tetrachloride, lead tetrabromide, lead tetraiodide, tin tetrachloride, tin tetrabromide, tin tetraiodide, germanium tetrachloride, germanium tetrabromide, and germanium tetraiodide. Preferably, the first precursor compound is selected from lead dichloride, lead dibromide, lead diiodide, tin dichloride, tin dibromide, and tin diiodide.

The first precursor compound may be a compound of formula MX$_4$ wherein M is a metal cation and X is a halide anion; and/or the second precursor compound may be a compound of formula AX' wherein A is said organic cation and X' is a halide anion. In some cases, X and X' are different halide anions. This is typically the case for hexahalometallates. The first precursor compound may, for instance, be selected from lead tetrafluoride, lead tetrachloride, lead tetrabromide, lead tetraiodide, tin tetrafluoride, tin tetrachloride, tin tetrabromide and tin tetraiodide.

The second precursor compound may, for instance, be selected from (H$_3$NR$^1$)X, (NR$^1$R$^2$R$^3$R$^4$)X, (R$^1$R$^2$N=CR$^3$R$^4$)X, (R$^1$R$^2$N—C(R$^5$)=NR$^3$R$^4$)X and (R$^1$R$^2$N—C(NR$^5$R$^6$)=NR$^3$R$^4$)X, wherein each of R$^1$, R$^2$, R$^3$, R$^4$, R$^5$ and R$^6$ is independently H, a substituted or unsubstituted C$_{1-20}$ alkyl group or a substituted or unsubstituted aryl group, and X is F$^-$, Cl$^-$, Br$^-$, or I$^-$. Preferably the second precursor compound is (H$_3$NR$^1$)X, wherein R$^1$ is an unsubstituted C$_{1-6}$ alkyl group and X is Cl$^-$, Br$^-$, or I$^-$.

The one or more second precursor compounds may, for example, be selected from CsF, CsCl, CsBr, CsI, NH$_4$F, NH$_4$Cl, NH$_4$Br, NH$_4$I, (CH$_3$NH$_3$)F, (CH$_3$NH$_3$)Cl, (CH$_3$NH$_3$)Br, (CH$_3$NH$_3$)I, (CH$_3$CH$_2$NH$_3$)F, (CH$_3$CH$_2$NH$_3$)Cl, (CH$_3$CH$_2$NH$_3$)Br, (CH$_3$CH$_2$NH$_3$)I, (N(CH$_3$)$_4$)F, (N(CH$_3$)$_4$)Cl, (N(CH$_3$)$_4$)Br, (N(CH$_3$)$_4$)I, (H$_2$N—C(H)=NH$_2$)F, (H$_2$N—C(H)=NH$_2$)Cl, (H$_2$N—C(H)=NH$_2$)Br and (H$_2$N—C(H)=NH$_2$)I. Typically, the second precursor compounds is selected from CsCl, CsBr, CsI, NH$_4$Cl, NH$_4$Br, NH$_4$I, (CH$_3$NH$_3$)Cl, (CH$_3$NH$_3$)Br, (CH$_3$NH$_3$)I, (CH$_3$CH$_2$NH$_3$)Cl, (CH$_3$CH$_2$NH$_3$)Br, (CH$_3$CH$_2$NH$_3$)I, (N(CH$_3$)$_4$)Cl, (N(CH$_3$)$_4$)Br, (N(CH$_3$)$_4$)I, (H$_2$N—C(H)=NH$_2$)Cl, (H$_2$N—C(H)=NH$_2$)Br and (H$_2$N—C(H)=NH$_2$)I.

Preferably, the first precursor compound is a lead dihalide, a tin dihalide or a copper dihalide, for instance lead diiodide, tin diiodide, copper dibromide or copper dichloride, and the second precursor compound is an alkylammonium halide, for instance methylammonium iodide, methylammonium bromide, or methylammonium chloride, or an ammonium halide, for instance ammonium iodide, ammonium bromide, or ammonium chloride. The first precursor compound may be lead diiodide and the second precursor compound may be methylammonium iodide. The first precursor compound may be lead diiodide and the second precursor compound may be methylammonium chloride. The first precursor compound may be tin diiodide and the second precursor compound may be methylammonium iodide. The first precursor compound may be copper dibromide and the second precursor compound may be methylammonium chloride. The first precursor compound may be copper dichloride and the second precursor compound may be methylammonium chloride. The first precursor compound may be copper dichloride and the second precursor compound may be ammonium bromide.

Substrate

The substrate may be any suitable substrate. For instance, the substrate may be a substrate suitable for a semiconductor device.

The substrate typically comprises a layer of a first electrode material. Thus the substrate typically comprises one or more first electrodes. The first electrode material may be any suitable electrically conductive material. Suitable conductive materials include metals, transparent conducting oxides, graphite, and conductive polymers. Examples of metals which may form the first electrode material include silver, gold, copper, aluminium, platinum, palladium, or tungsten. The first electrode material typically comprises, or consists essentially of, a transparent conducting oxide. The transparent conducting oxide may be selected from fluorine doped tin oxide (FTO), indium tin oxide (ITO), or aluminium zinc oxide (AZO), and preferably FTO. The first electrode material may form a single layer or may be patterned.

The substrate typically comprises a layer of an n-type semiconductor or a layer of a p-type semiconductor. Preferably, the layer of an n-type semiconductor or the layer of a p-type semiconductor is a compact layer. Compact layers are typically layers without open porosity. The thickness of the layer of an n-type semiconductor or the layer of a p-type semiconductor is typically from 10 nm to 500 nm. For instance, the thickness may be from 50 nm to 200 11M.

The n-type semiconductor may comprise an inorganic or an organic n-type semiconductor. A suitable inorganic n-type semiconductor may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped. Typically, the n-type semiconductor is selected from a metal oxide, a metal sulphide, a metal selenide, and a metal telluride. Thus, the n-type semiconductor may be an inorganic material selected from oxide of titanium, tin, zinc, niobium, tantalum, tungsten, indium, gallium, neodymium, palladium, or cadmium, or an oxide of a mixture of two or more of said metals. For instance, the n-type semiconductor may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Preferably, the n-type semiconductor comprises, or consists essentially of, $TiO_2$. The substrate may comprise a compact layer of titanium dioxide.

The p-type semiconductor may comprise an inorganic or an organic p-type semiconductor. Typically, the p-type semiconductor comprises an organic p-type semiconductor. Suitable ptype semiconductors may be selected from polymeric or molecular hole transporters. The ptype semiconductor may comprise spiro-OMeTAD (2,2',7,7'-tetrakis-(N,N-dipmethoxyphenylamine) 9,9'-spirobifluorene)), P3HT (poly (3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]) or PVK (poly(N-vinylcarbazole)). The p-type semiconductor may comprise carbon nanotubes. Usually, the p-type semiconductor is selected from spiro-OMeTAD, P3HT, PCPDTBT and PVK. Preferably, the p-type semiconductor is spiro-OMeTAD.

The substrate may, for instance, comprise a layer of a first electrode material and a layer of an n-type semiconductor. Often, the substrate comprises a layer of a transparent conducting oxide, for instance FTO, and a compact layer of an n-type semiconductor, for instance $TiO_2$.

In some embodiments, the substrate comprises a layer of a porous scaffold material.

The layer of a porous scaffold is usually in contact with a layer of an n-type or p-type semiconductor material, for instance a compact layer of an n-type semiconductor or a compact layer of a p-type semiconductor. The scaffold material is typically mesoporous or macroporous. The scaffold material may aid charge transport from the crystalline material to an adjacent region. The scaffold material may also aid formation of the layer of the crystalline material during deposition. The porous scaffold material is typically infiltrated by the crystalline material after deposition.

Typically, the porous scaffold material comprises a dielectric material or a charge-transporting material. The scaffold material may be a dielectric scaffold material. The scaffold material may be a charge-transporting scaffold material. The porous scaffold material may be an electron-transporting material or a hole-transporting scaffold material. N-type semiconductors are examples of electron-transporting materials. p-type semiconductors are examples of hole-transporting scaffold materials. Preferably, the porous scaffold material is a dielectric scaffold material or a electron-transporting scaffold material (e.g. an n-type scaffold material).

The porous scaffold material may be a charge-transporting scaffold material (e.g. an electrontransporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a material by using well-known procedures which do not require undue experimentation. For instance, the band gap of a material can be estimated by constructing a photovoltaic diode or solar cell from the material and determining the photovoltaic action spectrum. The monochromatic photon energy at which the photocurrent starts to be generated by the diode can be taken as the band gap of the material; such a method was used by Barkhouse et al., Prog. Photovolt: Res. Appl. 2012; 20:6-11. References herein to the band gap of a material mean the band gap as measured by this method, i.e. the band gap as determined by recording the photovoltaic action spectrum of a photovoltaic diode or solar cell constructed from the material and observing the monochromatic photon energy at which significant photocurrent starts to be generated.

The thickness of the layer of the porous scaffold is typically from 5 nm to 300 nm. For instance, the thickness of the layer of the porous scaffold may be from 10 nm to 50 nm.

The substrate may, for instance, comprise a layer of a first electrode material, a layer of an ntype semiconductor, and a layer of a dielectric scaffold material. The substrate may therefore comprise a layer of a transparent conducting oxide, a compact layer of $TiO_2$ and a porous layer of $Al_2O_3$.

The thickness of the layer of the first precursor compound is typically from 50 nm to 1000 nm. Thus, the layer of the first precursor compound may be deposited until it has a thickness of from 50 nm to 1000 nm. Often, the layer of the first precursor compound has a thickness of greater than or equal to 100 nm.

The layer of the first precursor compound is often without open porosity. The layer of the crystalline compound is often without open porosity.

Solvent Annealing Step

In some cases it is desirable to perform an additional solvent annealing step. The solvent annealing step can be used to obtain desired crystal sizes within the layer of the crystalline material. The solvent annealing step can be performed simultaneously with step (ii) to improve crystal formation. In the solvent annealing step the layer of the crystalline material, or layer comprising the first precursor compound and the crystalline material, is exposed to a solvent atmosphere and optionally heated in this atmosphere.

Thus, the process may further comprise: (iii) exposing the layer of the crystalline material to a vapour comprising a solvent.

The solvent annealing step may occur subsequently to step (ii) or simultaneously with step (ii). If steps (iii) and (ii) occur at the same time, the substrate comprising a layer of the first precursor compound is exposed to a vapour comprising both the second precursor compound and the solvent in a second chamber to produce the layer of a crystalline material.

The solvent may be any suitable solvent. The solvent may be a polar solvent or a non-polar solvent. Typically the solvent is a polar solvent. Examples of polar solvents include water, alcohol solvents (such as methanol, ethanol, n-propanol, isopropanol and n-butanol), ether solvents (such as dimethylether, diethylether and tetrahydrofuran), ester solvents (such as ethyl acetate), carboxylic acid solvents (such as formic acid and ethanoic acid), ketone solvents (such as acetone), amide solvents (such as dimethylformamide and diethylformamide), amine solvents (such as triethylamine), nitrile solvents (such as acetonitrile), sulfoxide solvents (dimethylsulfoxide) and halogenated solvents (such as dichloromethane, chloroform, and chlorobenzene). The solvent may be selected from polar protic solvents. Examples of protic polar solvents include water, methanol, ethanol, npropanol, isopropanol, n-butanol, formic acid, ethanoic acid. Examples of non-polar solvents include alkanes (such as pentane and hexane), cycloalkanes (such as cyclopentane and cyclohexane), and arenes (such as benzene, toluene and xylene).

The vapour comprising a solvent is usually produced by heating a sample of the solvent. The solvent may be heated at a temperature of from 10° C. to 200° C. For instance, the solvent may be heated at a temperature of from 50° C. to 150° C. The solvent annealing step may occur in the same chamber as step (ii), or the layer of the crystalline material may be transferred to another chamber before the solvent annealing step is performed. Step (iii) is typically performed in a sealed chamber containing the layer of the crystalline material and solvent.

The substrate is usually heated during the solvent annealing step. The layer of the crystalline material may be heated at a temperature of from 30° C. to 300° C. For instance, the layer of the crystalline material may be heated at a temperature of from 50° C. to 150° C. The layer of the crystalline material may be heated (i.e. annealed in the solvent atmosphere) for from 10 minutes to 24 hours. For instance, layer of the crystalline material may be heated for from 30 minutes to 12 hours, or from 1 hours to 6 hours. The pressure in the chamber during step (iii) is typically greater than or equal to 500 mbar. Typically, the pressure is approximately atmospheric, for instance from 950 mbar to 1050 mbar.

The process may further comprise an annealing step, step (iv). Thus, the process may further comprise: (iv) heating the layer of the crystalline material to a temperature of from 50° C. to 250° C. This step may be in addition to step (iii), or may occur instead of step (iii). Thus, the process of the invention may comprise: steps (i) and (ii); steps (i), (ii) and (iii); steps (i), (ii) and (iv); or steps (i), (ii), (iii) and (iv).

The layer of the crystalline material is typically heated at a temperature of from 50° C. to 200° C., for instance at from 100° C. to 200° C. The layer of the crystalline material may be heated (in step (iv)) for from 10 minutes to 24 hours. For instance, layer of the crystalline material may be heated for from 30 minutes to 12 hours, or from 1 hours to 6 hours. The pressure in the chamber during step (iv) is typically greater than or equal to 500 mbar.

Typically, the pressure is approximately atmospheric, for instance from 950 mbar to 1050 mbar.

One Step Process

The invention also provides a one step process for producing a layer of a crystalline material. Thus, the invention provides a process for producing a layer of a crystalline material, which process comprises exposing a layer of a first precursor compound on a substrate to a vapour comprising a second precursor compound in a chamber to produce the layer of a crystalline material, wherein the pressure in the chamber is greater than $10^{-4}$ mbar (for instance greater than or equal to 1 mbar) and less than atmospheric pressure.

A pressure which is less than atmospheric pressure will depend on the atmospheric pressure of the area in which the process is performed. Less than atmospheric pressure is typically less than or equal to 99% of atmospheric pressure. Often, less than atmospheric pressure is less than or equal to 95% of atmospheric pressure or less than or equal to 95% of atmospheric pressure. Less than atmospheric pressure may be less than or equal to 1000 mbar or less than or equal to 950 mbar. Thus, the pressure in the chamber may be greater than or equal to $10^{-4}$ mbar and less than or equal to 950 mbar. The pressure in the chamber is typically from 500 mbar to 900 mbar. For instance, the pressure in the chamber is typically from 500 mbar to 900 mbar.

The chamber in which the one-step process comprises a vapour comprising a second precursor compound. The chamber may also comprise other gases or vapours, for instance a carrier gas. Often, however, the chamber does not comprise nitrogen (or comprises a partial pressure of less than or equal to 100 mbar or less than equal to 1 mbar of nitrogen). Alternatively, or additionally, the chamber sometimes does not comprise oxygen (or comprises a partial pressure of less than or equal to 100 mbar or less than equal to 1 mbar of oxygen).

The layer of a first precursor compound on a substrate may be obtainable by solution-processing the first precursor compound or obtainable by vacuum deposition of the first precursor compound.

The one-step process according to the invention may be as described above for the two-step process of the invention. In particular, the one-step process may be as defined above for step (ii) of the two-step process. Thus, the first and second precursor compounds may be as defined above. The chamber in the one step process may be as defined for the second chamber above.

Layer

The invention also provides a layer of a crystalline material obtainable by a process according to the invention for producing a layer of a crystalline material.

The layer of a crystalline material may be as defined herein. For instance, the layer of a crystalline material may be a layer without open porosity. The crystalline material may a perovskite of formula (II) or a hexahalometallate compound of formula (III).

Process for Producing a Semiconductor Device

The invention also a process for producing a semiconductor device comprising a layer of a crystalline material, which process comprises producing said layer of a crystalline material by a process according to the invention.

The process typically further comprises disposing on the layer of a crystalline material a layer of a p-type semiconductor or a layer of a n-type semiconductor. Often, the process typically comprises disposing on the layer of a crystalline material a layer of a p-type semiconductor. The n-type or p-type semiconductor may be as defined herein. For instance, the p-type semiconductor may be an organic p-type semiconductor. Suitable p-type semiconductors may be selected from polymeric or molecular hole transporters. Preferably, the p-type semiconductor is spiro-OMeTAD. The layer of a p-type semiconductor or a layer of a n-type semiconductor is typically disposed on the layer of the crystalline material by solution processing, for instance by disposing a composition comprising a solvent and the n-type or ptype semiconductor. The solvent may be selected from polar solvents, for instance chlorobenzene or acetonitrile. The thickness of the layer of the p-type semiconductor or the layer of the n-type semiconductor is typically from 50 nm to 500 nm.

The process typically further comprises disposing on the layer of the p-type semiconductor or n-type semiconductor a layer of a second electrode material. The second electrode material may be as defined above for the first electrode material. Typically, the second electrode material comprises, or consists essentially of, a metal. Examples of metals which the second electrode material may comprise, or consist essentially of, include silver, gold, copper, aluminium, platinum, palladium, or tungsten. The thickness of the layer of a second electrode material is typically from 5 nm to 100 nm.

Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, or a light-emitting diode.

The semiconductor device is typically an optoelectronic device. Examples of optoelectronic devices include photovoltaic devices, photodiodes (including solar cells), phototransistors, photomultipliers, photoresistors, and light emitting devices. Preferably, the semiconductor device is a photovoltaic device.

The invention also provides a semiconductor device obtainable by a process for producing a semiconductor device according to the invention.

A photovoltaic device according to the invention may comprise the following layers in the following order:
I. a layer of a first electrode material as defined herein;
II. a layer of an n-type semiconductor as defined herein
III. optionally a layer of a porous scaffold material as defined herein;
IV. a layer of a crystalline material as defined herein;
V. a layer of an p-type semiconductor as defined herein; and
VI. a layer of a second electrode material as defined herein.

A photovoltaic device according to the invention may comprise the following layers in the following order:
I. a layer of a transparent conducting oxide, preferably FTO;
II. a compact layer of an n-type semiconductor as defined herein, preferably $TiO_2$;
III. optionally a layer of a porous scaffold material as defined herein, preferably $Al_2O_3$ or $TiO_2$;
IV. a layer of a crystalline material as defined herein;
V. a layer of an p-type semiconductor as defined herein, preferably spiro-OMeTAD; and
VI. a layer of a second electrode material comprising gold or silver.

The layer of the first electrode material may have a thickness of from 100 nm to 700 nm, for instance of from 100 nm to 400 nm. The layer of the second electrode material may have a thickness of from 10 nm to 500 nm, for instance from 50 nm to 200 nm or from 10 nm to 50 nm. The layer of an n-type semiconductor may have a thickness of from 50 nm to 500 nm. The layer of an p-type semiconductor may have a thickness of from 50 nm to 500 nm.

The invention will now be further described by the following Examples.

EXAMPLES

Example 1

A photovoltaic device comprising a layer of a methylammonium lead iodide perovskite was produced by the following procedure which includes the two-step vapour/vapour deposition method according to the invention. FTO glass was first cleaned before being spin-coated with an electron selective layer of $TiO_2$ having a thickness of approximately 50 nm. A layer of lead diiodide ($PbI_2$) was then evaporated onto the electron selective layer at a pressure of approximately 5×10-6 mbar and a rate of 0.2 nm/s until a layer of $PbI_2$ having a thickness of from 250 to 300 nm was formed. The sample comprising the PbI2 layer was then transferred through a lab atmosphere to a nitrogen filled glovebox. The sample was put in a covered glass container at atmospheric pressure together with methylammonium iodide (MAI, $CH_3NH_3I$) and the container was heated to 150° C. The substrate and the MAI powder were held at the same temperature for 2 hours. The $PbI_2$ layer was converted to methylammonium lead iodide perovskite under exposure to the sublimed vapour of MAI. The device was completed by spin-coating a layer of spiro-OMeTAD as a hole transport material and finally evaporating Au/Ag electrodes.

A scanning electron microscope (SEM) image of a top view of the layer of the methylammonium lead iodide perovskite produced by this two-step deposition method is shown in FIG. 1(A). Short and large scale cross-sections of the device incorporating the methylammonium lead iodide film grown by this two-step vapour deposition are shown in FIGS. 1(B) and 1(C) respectively. FIGS. 1(B) and 1(C) show that the produced perovskite films have considerable uniformity of surface coverage and thickness.

Figure 2:
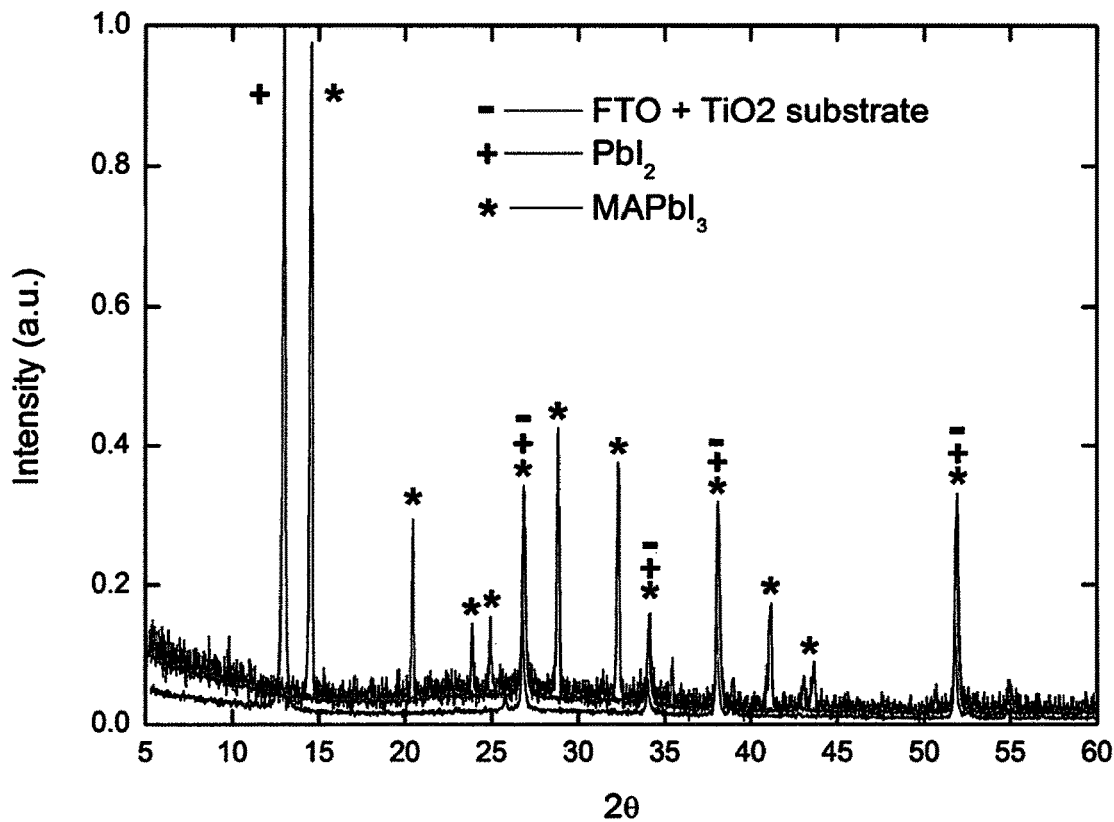
FIG. 2 shows an XRD pattern comparing evaporated $PbI_2$ before (peaks marked with +) and after (peaks marked with *) MAI (methyl ammonium iodide) vapour treatment. This shows that after treatment all of the $PbI_2$ is converted into $MAPbI_3$. Additional peaks (marked with −) originating from the substrate are highlighted in the control spectrum.

Powder X-ray diffraction (XRD) patterns were taken before and after the conversion of the $PbI_2$ layer to the perovskite. These are shown in FIG. 2 together with a control XRD pattern of the FTO+$TiO_2$ substrate. Peaks observed in the FTO+$TiO_2$ substrate XRD are marked with a dash (-), peaks observed in the $PbI_2$ XRD are marked with a plus (+) and peaks observed in the $MAPbI_3$ XRD are marked with an asterisk (*). These peaks show that the $PbI_2$ has been converted to $MAPbI_3$.

Figure 3:
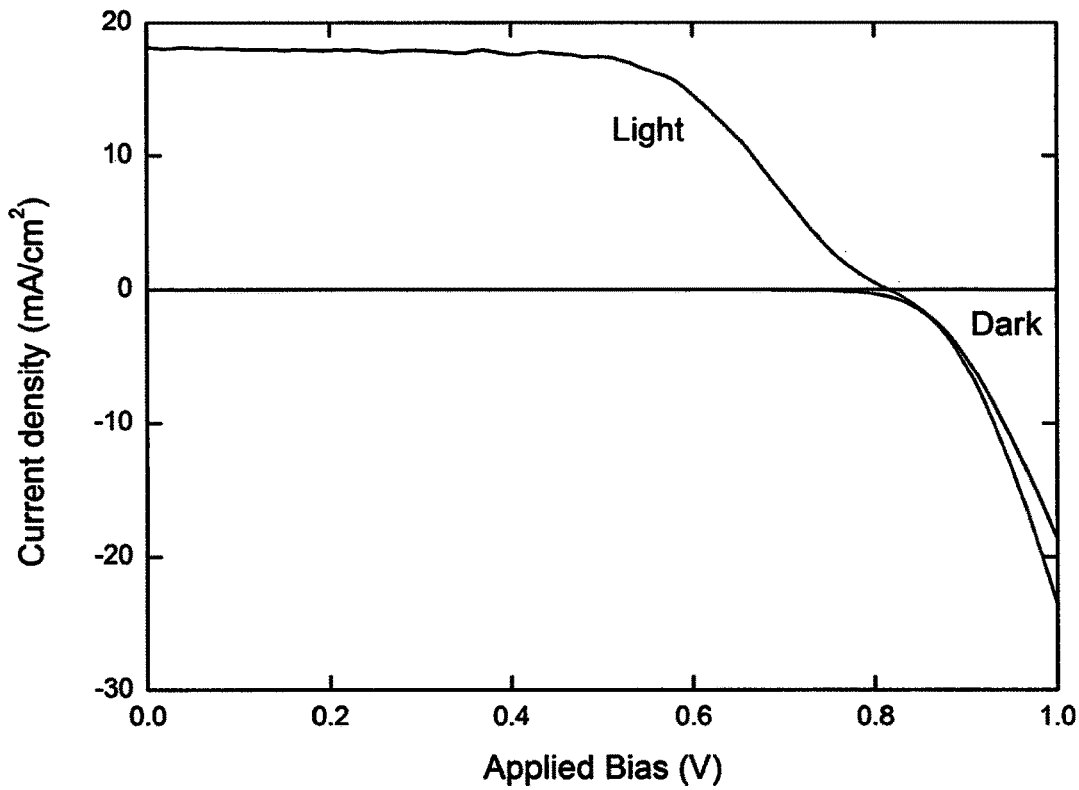
FIG. 3 shows current voltages characteristics under simulated AM1.5 sunlight (upper curve is light; lower curve is dark) for a device comprising a photoactive layer of methylammonium lead triiodide produced by a two-step vapour/vapour deposition.
Figure 4:
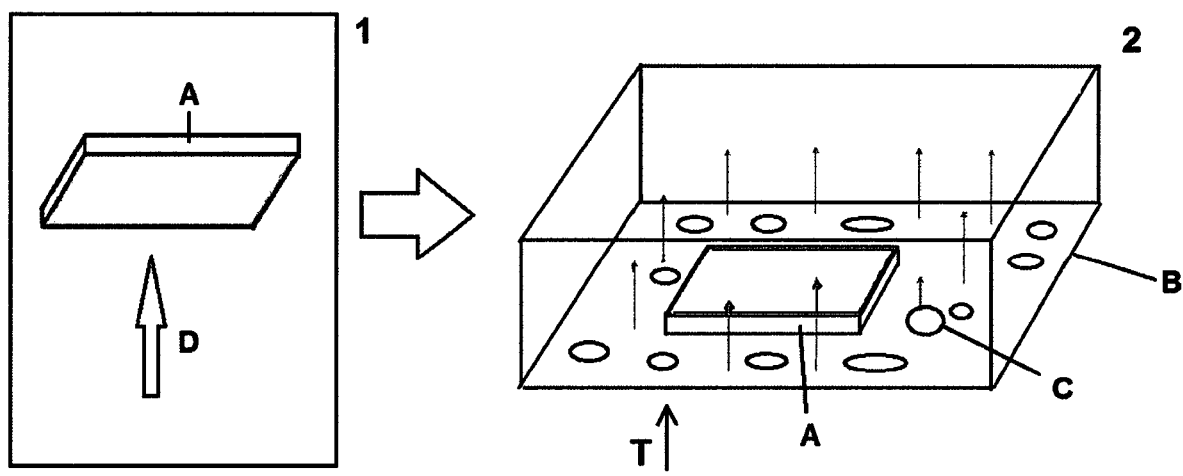
FIG. 4 shows a schematic diagram of an example of a two-step process according to the invention. In step 1 a substrate (A) is exposed to a vapour of a first precursor compound (for instance by vacuum deposition). In step 2 a substrate (A) comprising a layer of the first precursor compound is placed in a second chamber (B) together with solid second precursor compound (C) and the second chamber is heated (T) to produce a sublimed vapour of the second precursor compound.

The device produced by the above method was characterised under simulated AM1.5 sunlight. The current-voltage characteristics of the device are shown in FIG. 3. The device performance parameters measured were: $J_{SC}$=18.1 mA/cm$^2$; $V_{OC}$=0.81 V; FF=0.62; power conversion efficiency (PCE) =9.24%; and intensity=0.986 suns. A significant PCE of 9.24% was therefore observed by a device produced by a method using a two-step vapour deposition method according to the invention. A schematic diagram of the two-step vapour deposition process is shown in FIG. 4.

Example 2

Figure 5:
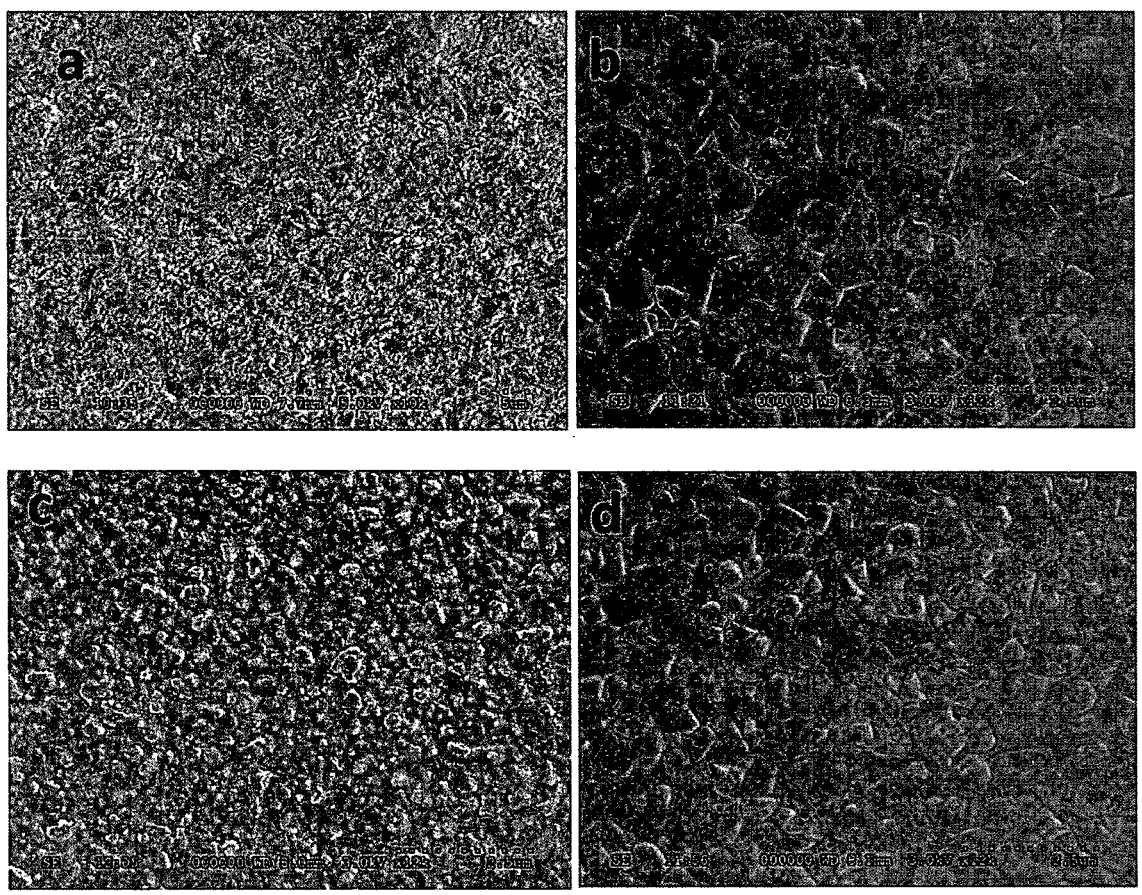
FIG. 5 shows conversion of lead iodide to methylammonium lead triiodide via a two-stage process, one with spin-coated lead iodide and one with evaporated lead iodide. The Figure shows scanning electron micrographs of a) spin-coated lead iodide surface, b) methylammonium lead triiodide surface produced by atmospheric vapour phase organic treatment of spin-coated lead iodide, c) evaporated lead iodide surface, d) methylammonium lead triiodide surface produced by atmospheric vapour phase organic treatment of spin-coated lead iodide.

Layers of lead iodide ($PbI_2$) were produced by either spin-coating a solution comprising $PbI_2$ (comparative) or by vacuum evaporating $PbI_2$ at a pressure of approximately $5 \times 10^{-6}$ mbar (the invention). These layers were then exposed to a sublimed vapour of methylammonium iodide (MAI) at approximately atmospheric pressure for 90 minutes by placing the $PbI_2$ layers in a heated sealed container with MAI powder. FIG. 5 shows SEM images of top-views of the produced layers. FIG. 5(a) shows a top-view SEM of a spin-coated $PbI_2$ surface. FIG. 5(b) shows a top-view SEM of a methylammonium lead triiodide surface produced by exposing the spin-coated $PbI_2$ surface of FIG. 5(a) to the vapour of MAI. FIG. 5(c) shows a top-view SEM of an evaporated $PbI_2$ surface. FIG. 5(d) shows a top-view SEM of a methylammonium lead triiodide surface produced by exposing the evaporated $PbI_2$ surface of FIG. 5(c) to the vapour of MAI.

Figure 6:
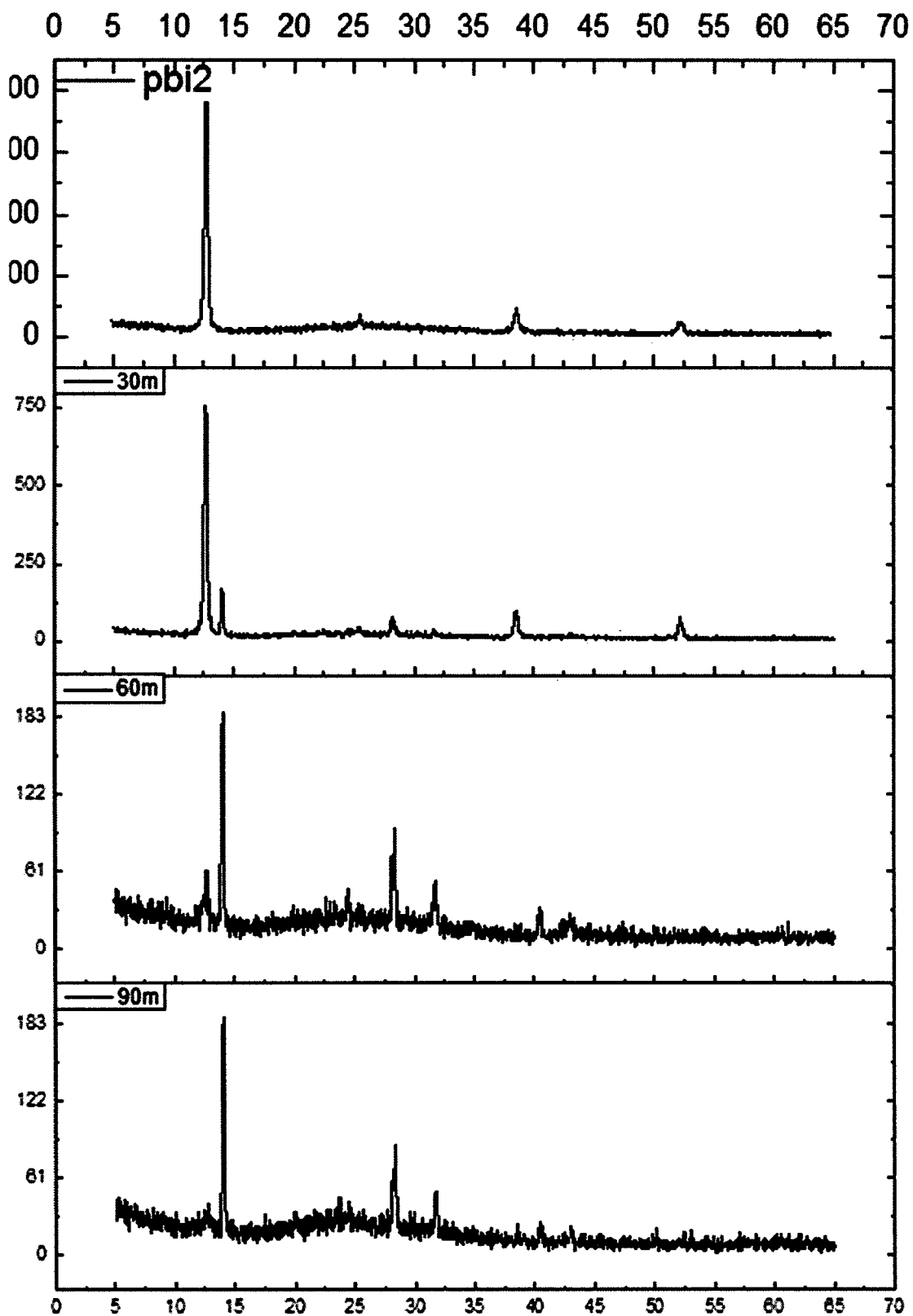
FIG. 6 shows X-ray diffraction patterns of a film of spin-coated lead iodide undergoing conversion to methylammonium lead triiodide after a certain time in the methylammonium iodide atmosphere. Total conversion is observed after ~1 h 30 m. Horizontal axes represent 2θ. Vertical axes represent arbitrary units.
Figure 7:
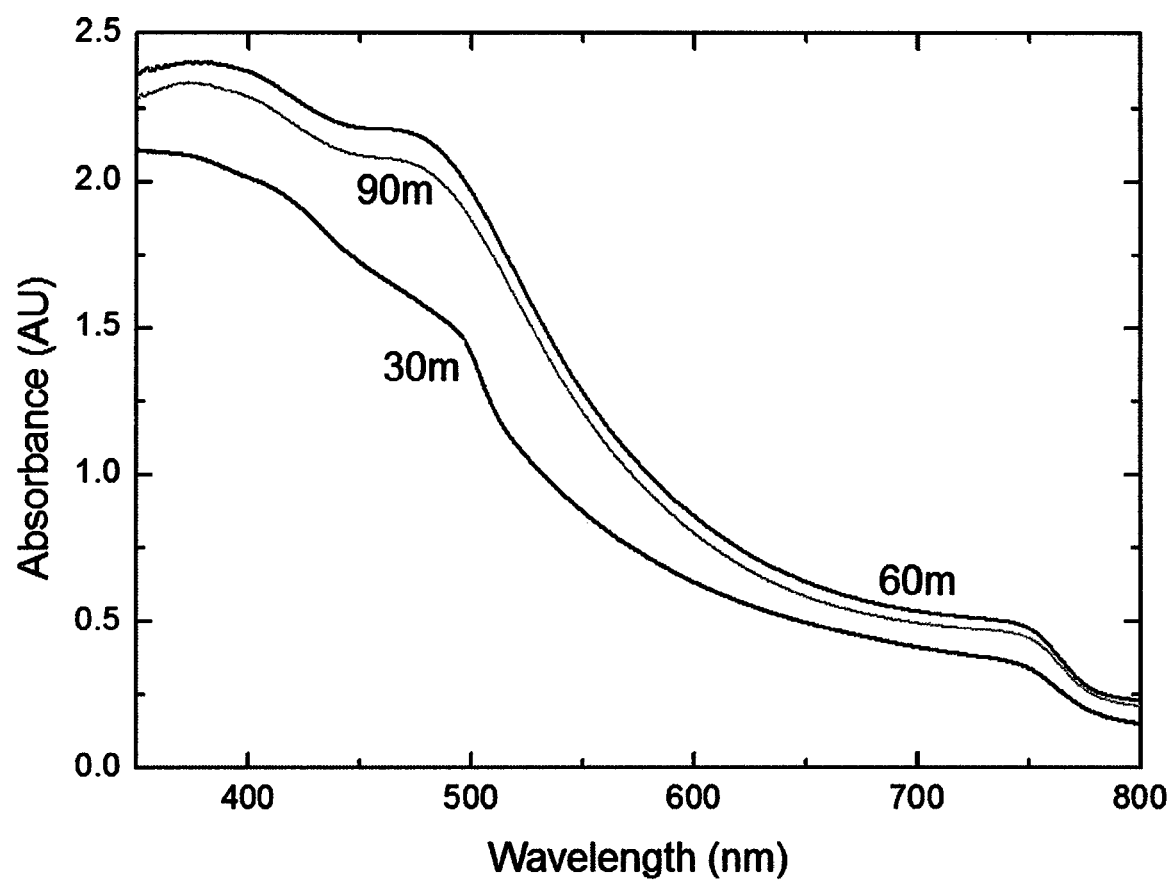
FIG. 7 shows UV-vis absorbance spectra of the methylammonium lead triiodide films produced from spin-coated lead iodide after a certain time in a methylammonium iodide atmosphere (30, 60 or 90 minutes).

The conversion of the spin-coated layer of $PbI_2$ to $CH_3NH_3PbI_3$ can be seen in FIG. 6 which shows a number of XRD patterns taken of the $PbI_2$ film before exposure to the MAI vapour and after 30 minutes exposure, 60 minutes exposure and 90 minutes exposure. After 90 minutes total conversion of the layer to the perovskite methylammonium lead triiodide is observed. The conversion of the spin-coated layer of $PbI_2$ to $CH_3NH_3PbI_3$ can also be observed from FIG. 7 which shows the change in the UV vis absorbance spectra of the methylammonium lead triiodide films produced after exposure of the spin-coated $PbI_2$ to the MAI atmosphere after 30, 60 or 90 minutes.

Figure 8:
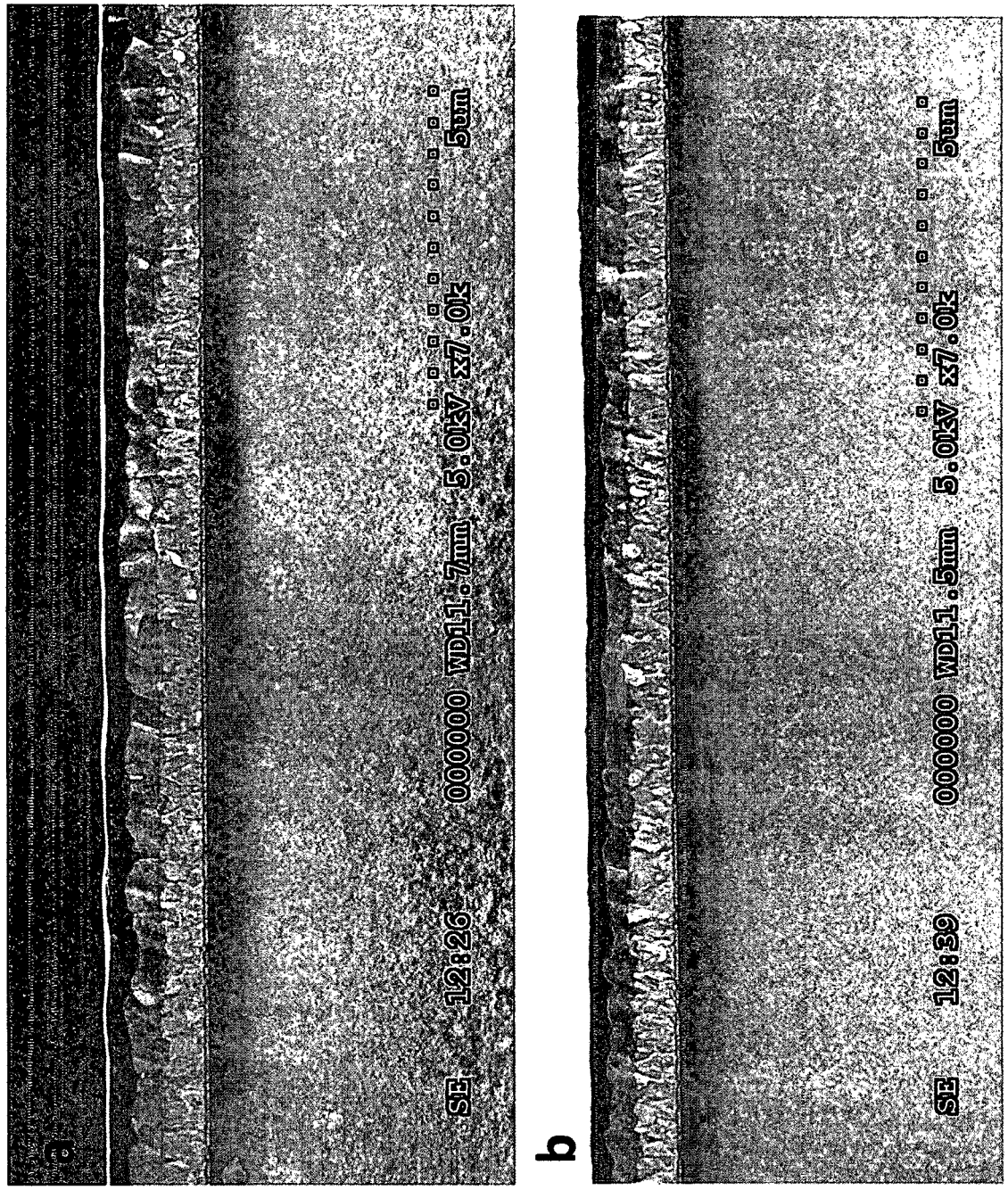
FIG. 8 shows photovoltaic devices comprising methylammonium lead triiodide fabricated via organic vapour conversion of spin-coated and evaporated lead triiodide: a) cross-sectional SEM of device formed from converted spin-coated lead iodide; and b) cross-sectional SEM of device formed from converted evaporated lead iodide.

Photovoltaic devices were then constructed comprising methylammonium lead triiodide films fabricated by organic vapour conversion of spin-coated or evaporated $PbI_2$ films as described above. The devices were completed by spin-coating a solution comprising spiro-OMeTAD as a hole-transporter material and evaporating Au/Ag electrodes. Cross-sectional SEM images of the completed devices are shown in FIG. 8, with (a) showing the cross-section of a device containing a perovskite layer produced from spin-coated $PbI_2$ and (b) showing the cross-section of a device containing a perovskite layer produced from evaporated $PbI_2$. In the SEM images the layers, from bottom to top, are: glass, FTO, compact $TiO_2$, $MAPbI_3$ perovskite, spiro-OMeTAD, Au/Ag electrode. These are planar heterojunction devices.

Comparative Example 1

Figure 9:
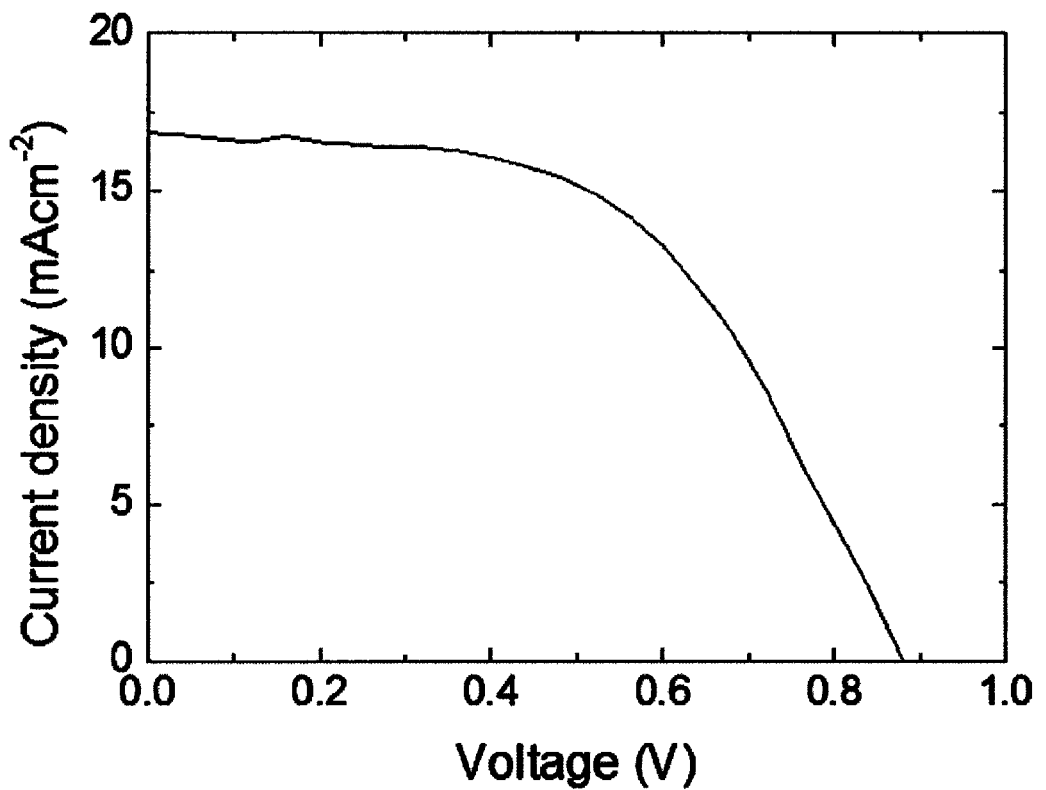
FIG. 9 shows current-voltage characteristics of methylammonium lead triiodide solar cells fabricated via spin-coated $PbI_2$/vapour deposited MAI: as a planar heterojunction (upper); and on mesoporous $TiO_2$ (lower).
Figure 9:
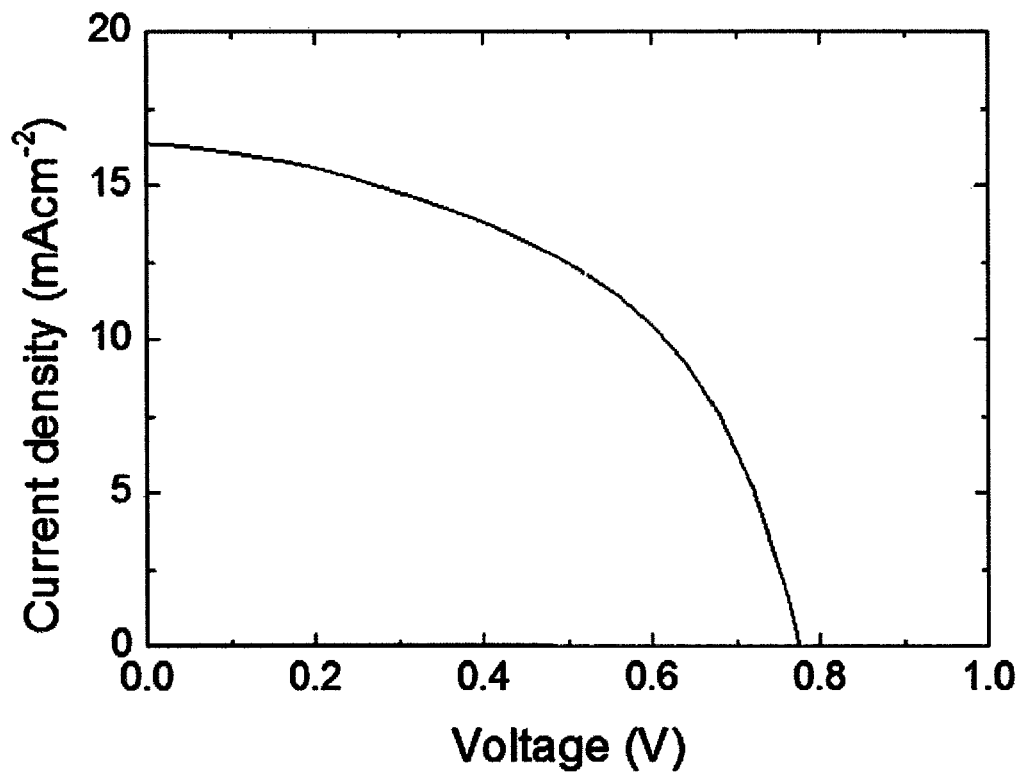

A photovoltaic device comprising a methylammonium lead triiodide perovskite layer produced from the spin-coated layer of $PbI_2$ together with a mesoporous layer of $TiO_2$ was also produced. The perovskite was then formed from the spin-coated layer of $PbI_2$ by exposure to a saturated atmosphere of MAI as in Examples 1 and 2. The structure of this device was the same as the planar heterojunction devices produced in Example 2 except the additional mesoporous layer was included between the compact $TiO_2$ layer and the perovskite. The current-voltage device characteristics of the planar heterojunction device containing the perovskite derived from spin-coated $PbI_2$ is shown in FIG. 9 (upper) together with the device comprising a methylammonium lead triiodide perovskite layer produced from the spin-coated layer of $PbI_2$ together with a mesoporous layer of TiO2 (lower). Both devices were produced by spin coating layers of $PbI_2$. The device parameters of the planar heterojunction device (upper figure) are: $J_{SC}$=16.9 mA/cm$^2$; $V_{OC}$=0.88 V; FF=0.54; and PCE=7.69%. The device parameters of the mesoporous $TiO_2$ device (lower figure) are: $J_{SC}$=16.4 mA/cm$^2$; $V_{OC}$=0.76 V; FF=0.51; and PCE=6.17%. It can therefore be seen that the vapour-vapour two-step process of Example 1 produces devices which outperform (PCE of 9.24%) those produced by a solution-vapour two-step process (FIG. 9, Comparative Example 1, PCEs of less than 7.7%).

Example 3

Figure 10:
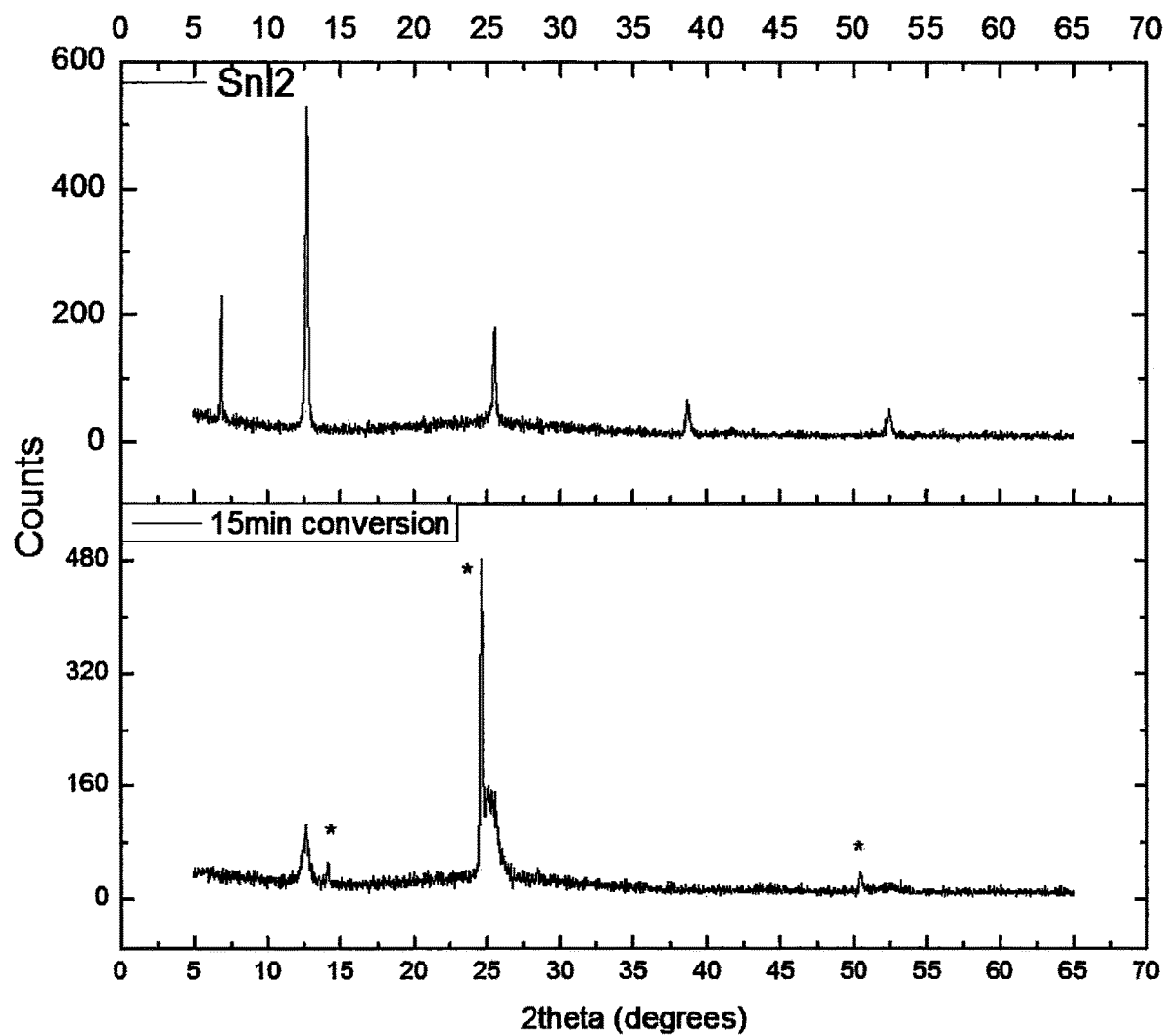
FIG. 10 shows XRD spectra showing partial conversion of a film of spin-coated tin iodide into methylammonium tin triiodide, after treatment in a methylammonium iodide atmosphere. Perovskite peaks are labelled with a *.

A two-step process was used to produce other perovskite materials. Methylammonium tin iodide was produced by converting a spin-coated layer of tin iodide in a methylammonium iodide (MAI) atmosphere. The partial conversion of the layer of $SnI_2$ to $CH_3NH_3SnI_3$ is shown in FIG. 10 which shows the XRD patter of SnI2 alone and after 15 exposure to an MAI atmosphere. Perovskite peaks are marked with a *.

Figure 11:
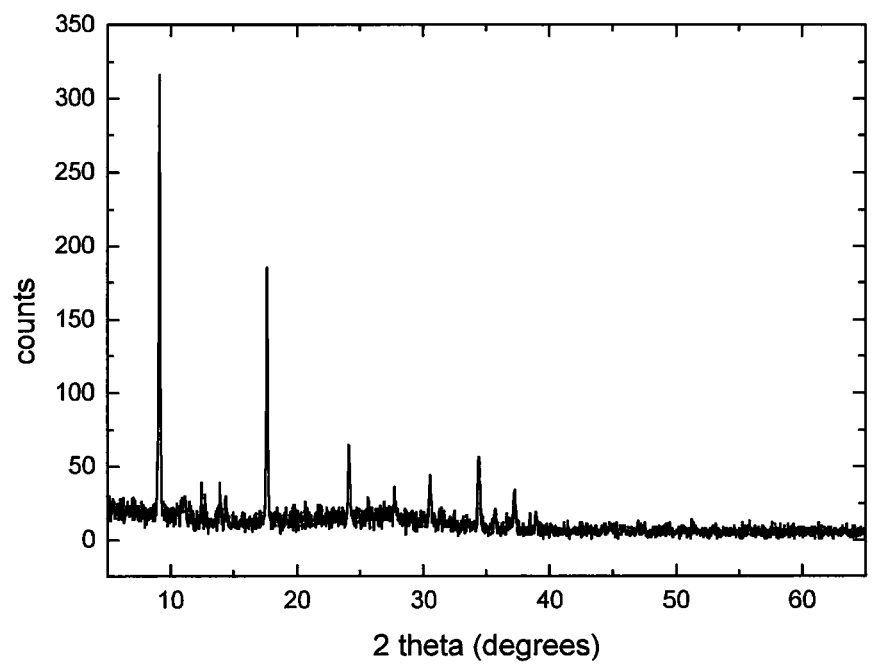
FIG. 11 shows the XRD of a new copper-based material formed using a spin-coating metal halide/vapour deposited organic method with $CuBr_2$ and methylammonium chloride.
Figure 12:
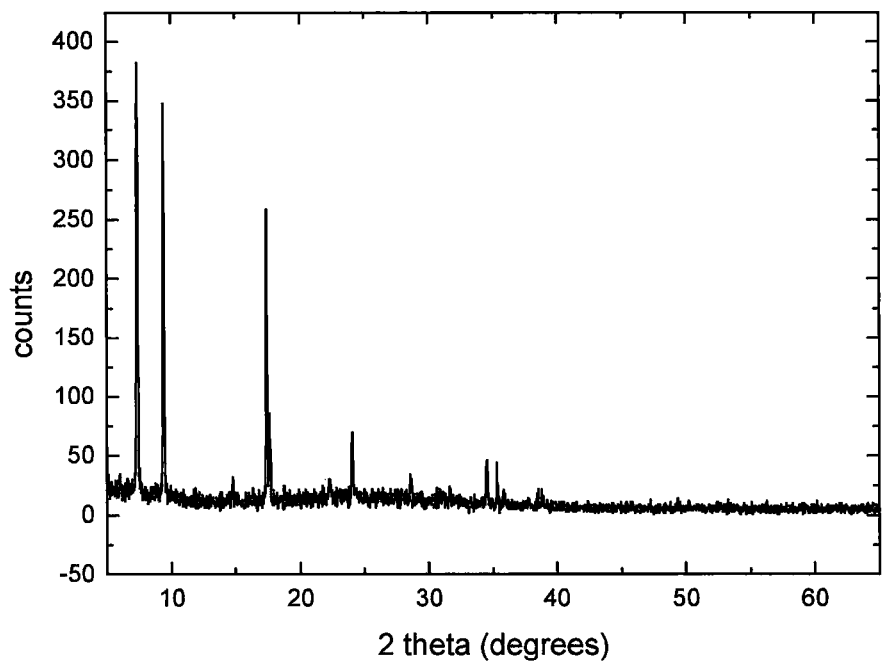
FIG. 12 shows the XRD of a copper-based material formed using a spin-coating metal halide/vapour deposited organic method with $CuCl_2$ and methylammonium chloride.
Figure 13:
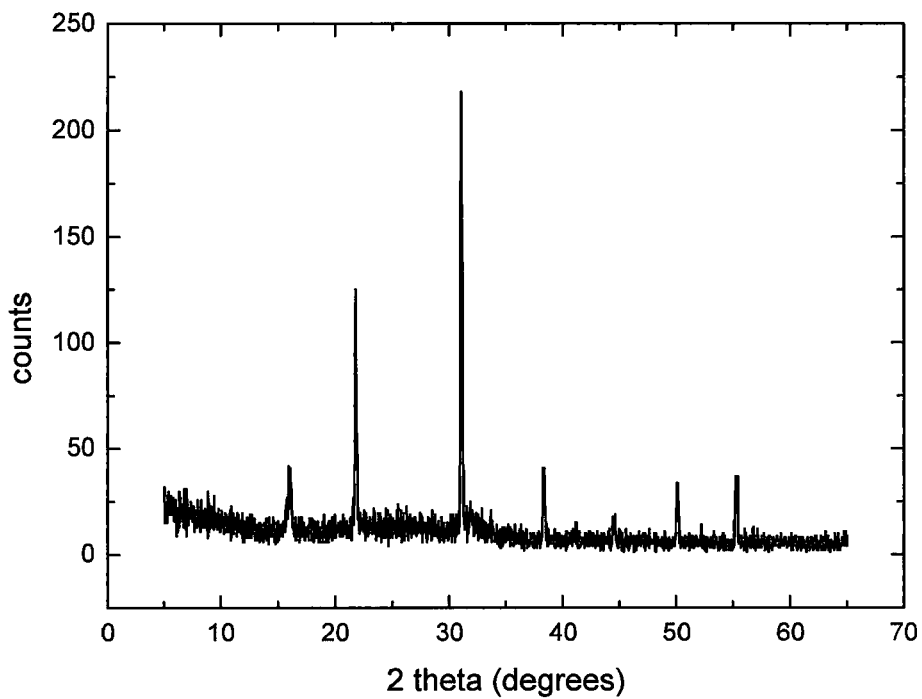
FIG. 13 shows the XRD of a copper-based material formed using a spin-coating metal halide/vapour deposited organic method with $CuCl_2$ and ammonium chloride.
Figure 14:
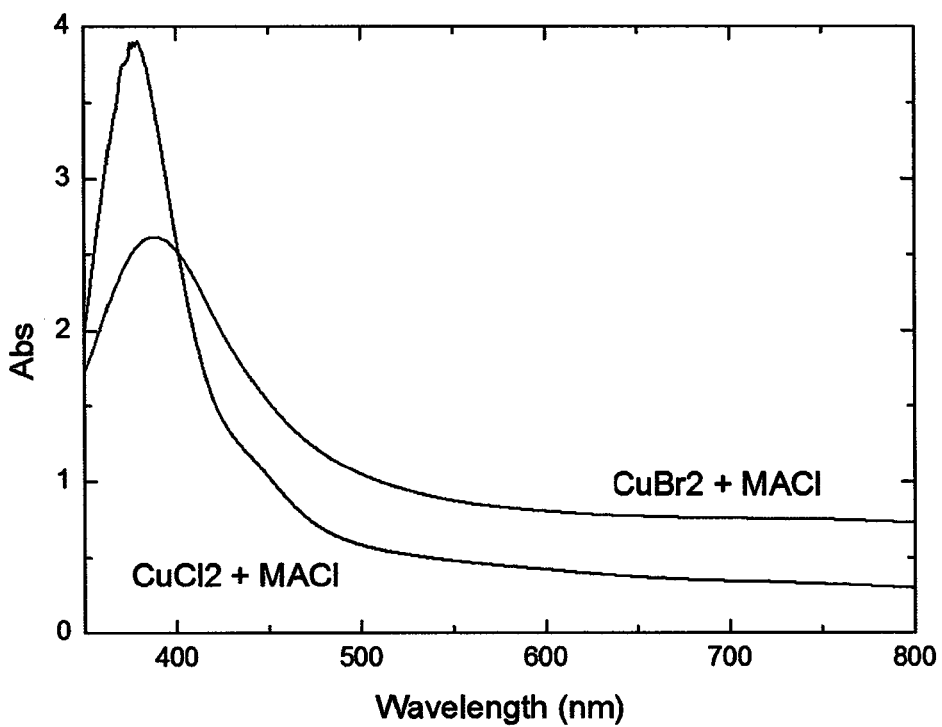
FIG. 14 shows UV-Vis absorption of copper-based materials formed from $CuBr_2$ and methylammonium chloride and $CuCl_2$ and methylammonium chloride using a spin-coating metal halide/vapour deposited organic method.

FIGS. 11, 12 and 13 show XRD patterns of copper based materials produced using a spin-coated metal halide/vapour deposited organic method. Exposure to the atmosphere of the nitrogen containing component was for approximately 90 minutes. FIG. 11 shows the XRD of a perovskite produced by exposing a spin-coated layer of $CuBr_2$ to an atmosphere of methylammonium chloride. FIG. 12 shows the XRD of a perovskite produced by exposing a spin-coated layer of $CuCl_2$ to an atmosphere of methylammonium chloride. FIG. 13 shows the XRD of a perovskite produced by exposing a spin-coated layer of $CuCl_2$ to an atmosphere of ammonium chloride ($NH_4Cl$). The UV-vis absorption spectra of the first two of these materials ($CuBr_2$+methylammonium chloride and $CuCl_2$+methylammonium chloride) are shown in FIG. 14.

Comparative Example 2

In order to provide a comparison with a vacuum/solution based method, the following experiment was performed. A thin $TiO_2$ electron-selective layer was spin-coated from a mildly acidic precursor solution of titanium isopropoxide in anhydrous ethanol onto clean FTO-coated glass and annealed for 30 minutes at 500° C. This was then transferred to a vacuum evaporation chamber and a 250 nm thin-film of either $PbI_2$ or $PbCl_2$ was evaporated at a pressure of ~$5 \times 10^{-6}$ mbar. The substrates are then dipped into a solution of methylammonium iodide (MAI) in anhydrous isopropanol for a prescribed time. The reaction rate was thermally controlled by placing the reaction vessel on a hotplate. During this step MAI intercalates into the lead halide lattice to form the perovskite. When the reaction was complete, the sample was rinsed in isopropanol and dried. For devices, a solution of spiro-OMeTAD in chlorobenzene containing Li-TFSI and tert-butyl pyridine was spin-coated onto the perovskite layer as the hole-selective contact. The devices were completed following thermal evaporation of silver top contacts in vacuum.

Figure 15:
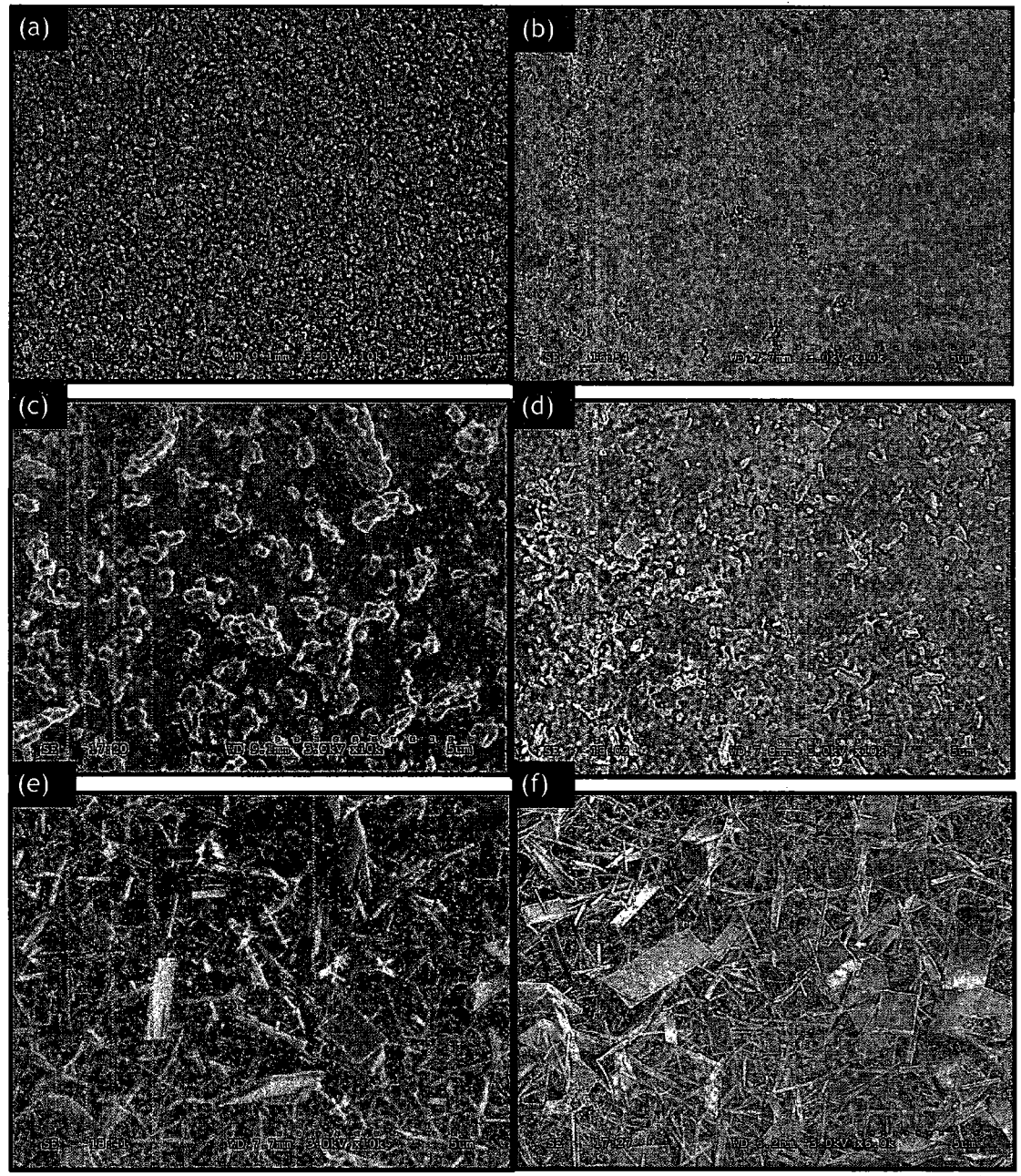
FIG. 15 shows SEM images showing the evolution of perovskite crystal growth at room temperature by dip coating a $PbCl_2$ thin-film into a 20 mg/ml isopropanol solution of methylammonium iodide after (a) 0 s, (b) 1 s, (c) 10 s, (d) 100 s, (e) 1000 s, (f) 10000 s.
Figure 16:
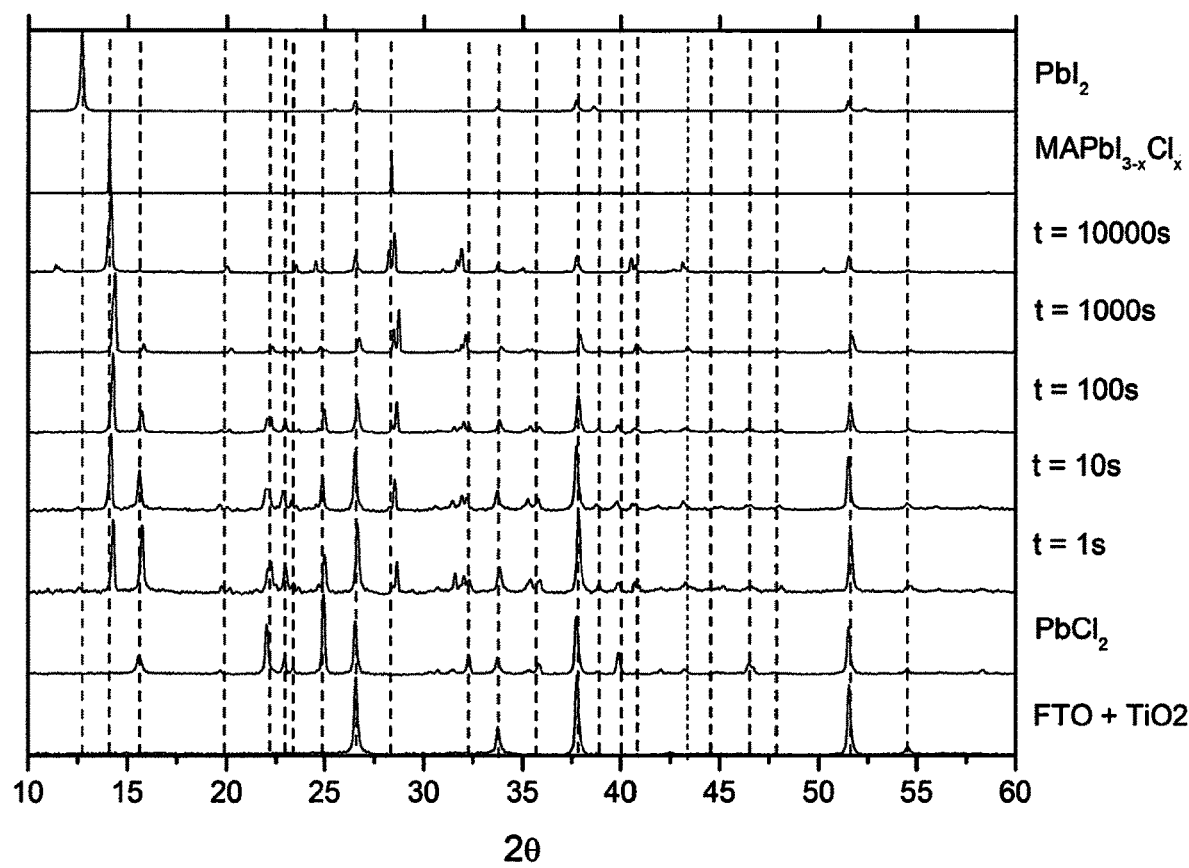
FIG. 16 shows normalised XRD spectra for perovskite films at different dipping times, t.

SEM images showing the evolution of perovskite crystal growth at room temperature by dip coating a $PbCl_2$ thin-film into a 20 mg/ml isopropanol solution of methylammonium iodide after (a) 0 s, (b) 1 s, (c) 10 s, (d) 100 s, (e) 1000 s, (f) 10000 s are shown in FIG. 15. The growth mode leads to random protrusions of plate-like and needle-like perovskite crystals from the surface providing high-levels of roughness. FIG. 16 then shows the normalised XRD spectra for films at different dipping times, t. The spectra indicate that perovskite formation occurs immediately upon dip coating the film, $PbCl_2$ is consumed as the dipping time increases, and the reaction is almost complete after 10000 s. This corresponds with a very rough film as shown in FIG. 15(f).

Figure 17:
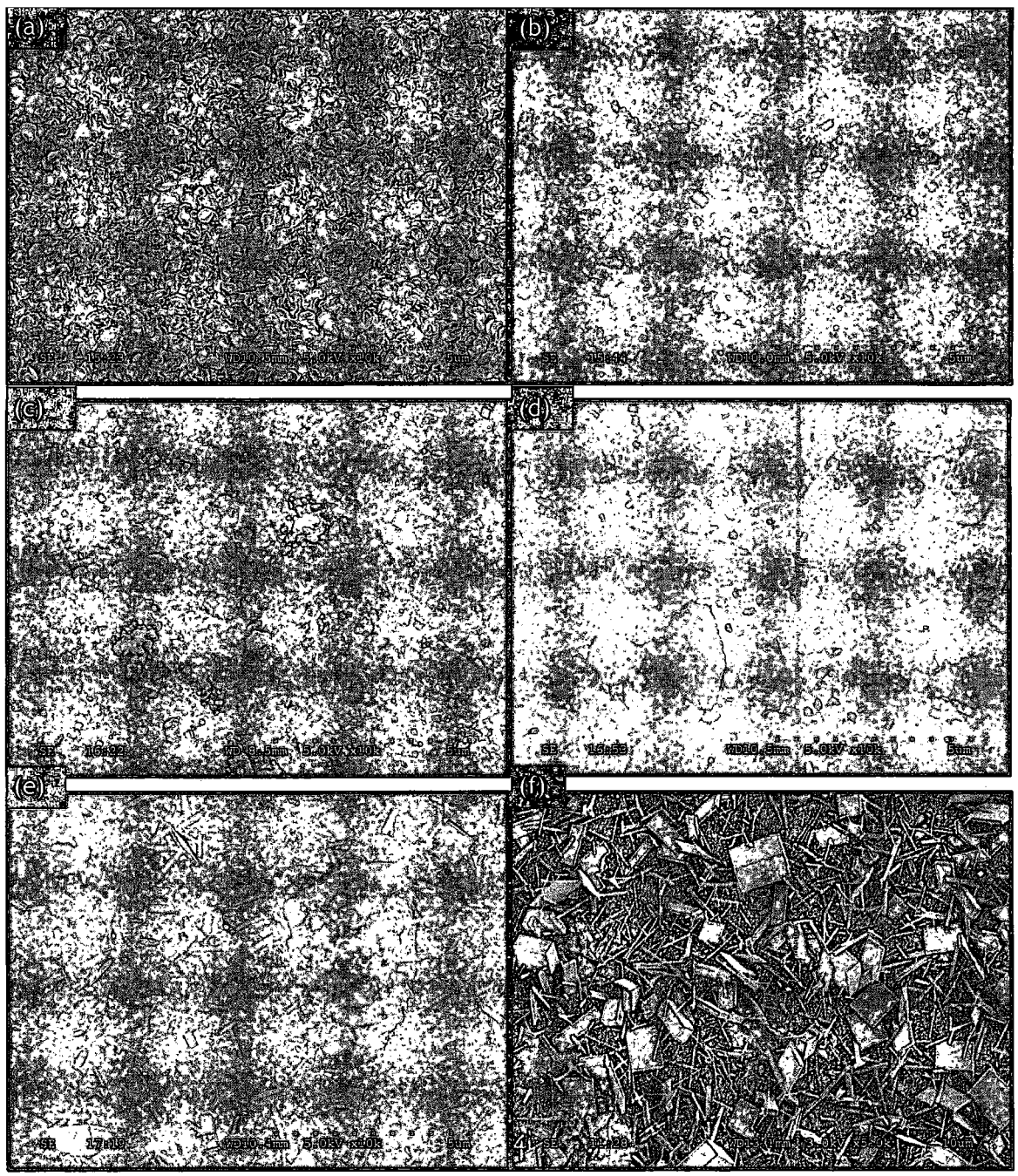
FIG. 17 shows SEM images showing the evolution of perovskite crystal growth at room temperature by dip coating a $PbI_2$ thin-film into a 20 mg/ml isopropanol solution of methylammonium iodide after (a) 0 s, (b) 1 s, (c) 10 s, (d) 100 s, (e) 1000 s, (f) 8000 s.
Figure 18:
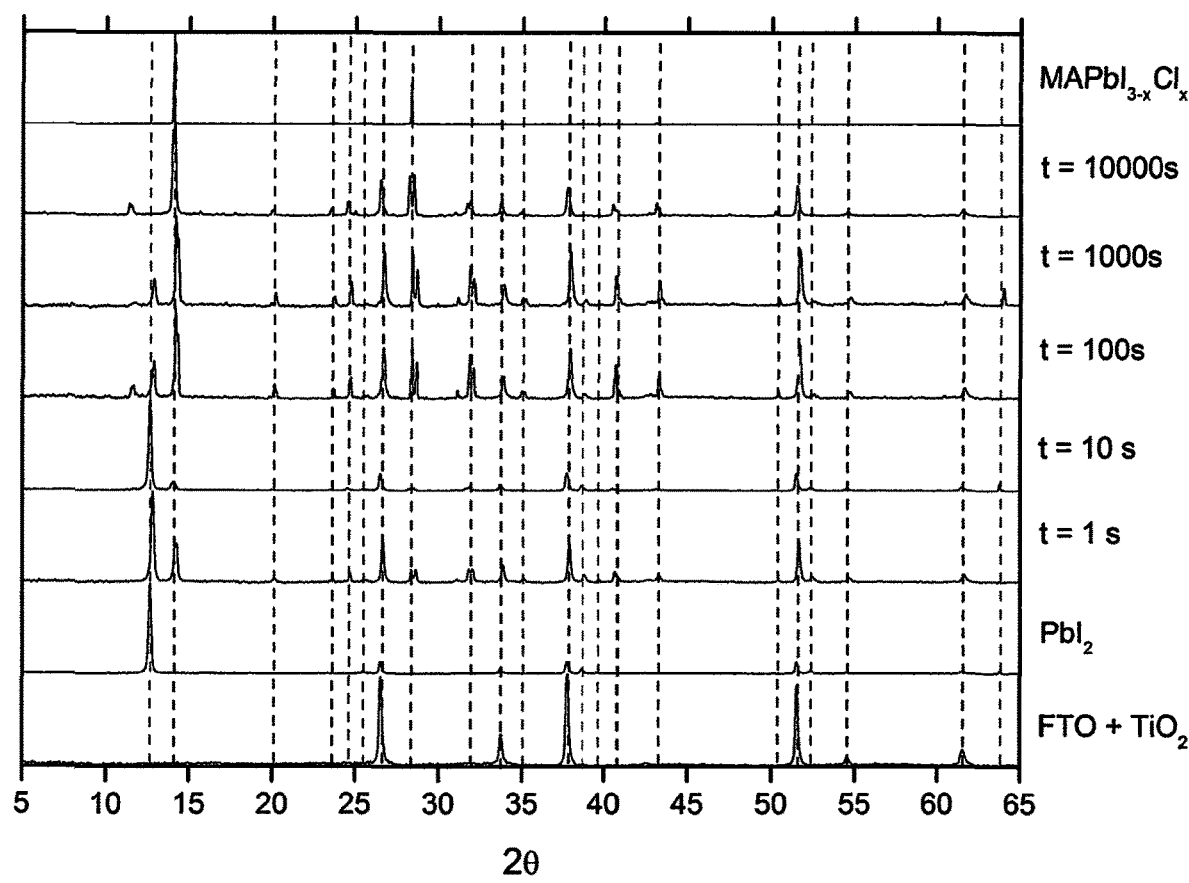
FIG. 18 shows normalised XRD spectra for perovskite films at different dipping times, t.

SEM images showing the evolution of perovskite crystal growth at room temperature by dip coating a $PbI_2$ thin-film into a 20 mg/ml isopropanol solution of methylammonium iodide after (a) 0 s, (b) 1 s, (c) 10 s, (d) 100 s, (e) 1000 s, (f) 8000 s are shown in FIG. 17. The growth mode also leads to random protrusions of plate-like and needle-like perovskite crystals from the surface providing high-levels of roughness. FIG. 18 then shows the normalised XRD spectra for films at different dipping times, t. The spectra indicate that perovskite formation occurs immediately upon dip coating the film, PbI2 is consumed as the dipping time increases, and the reaction is complete at some point between 1000-10000 s. This corresponds with a very rough film as shown in FIG. 17(f).

Figure 19:
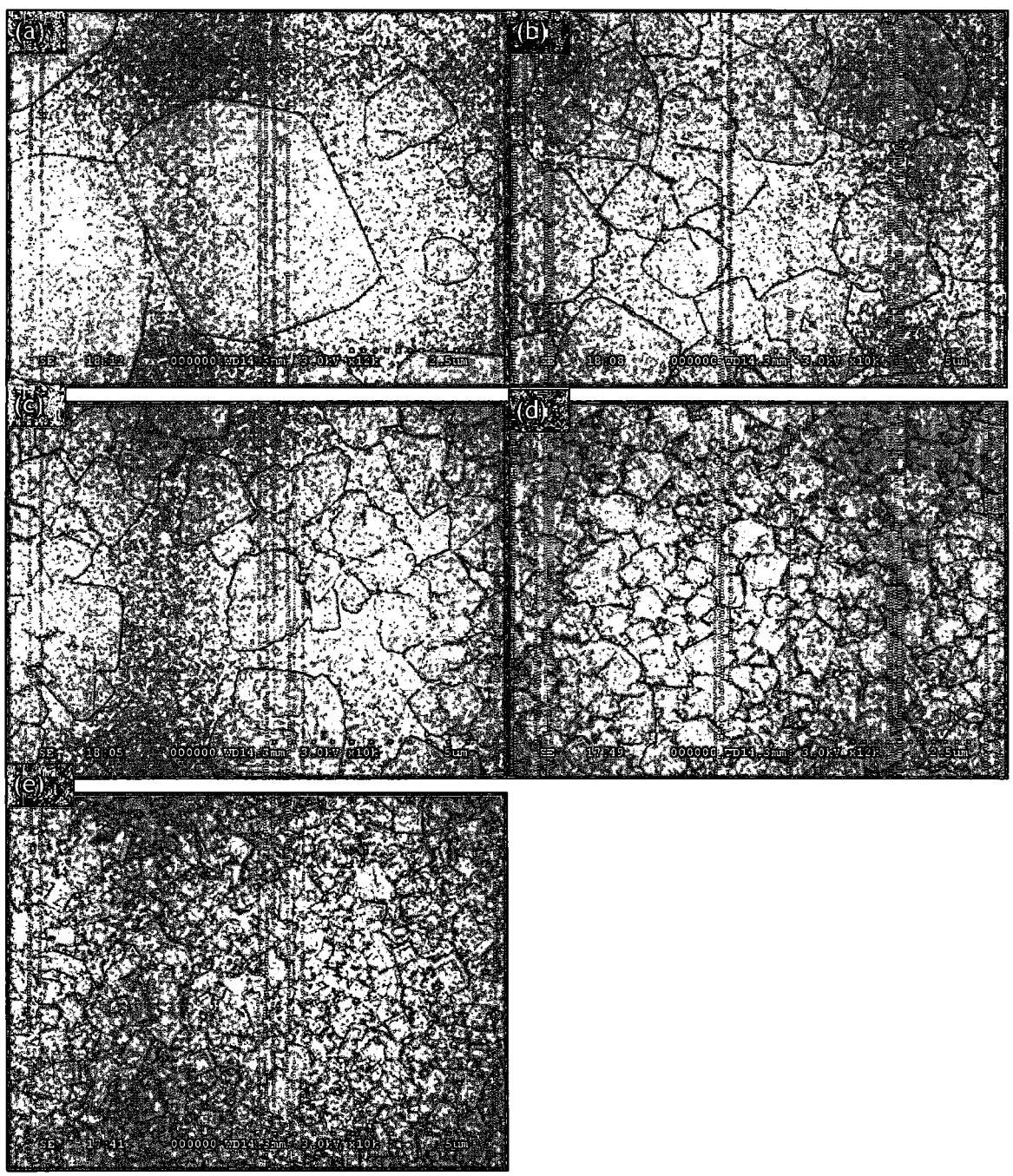
FIG. 19 shows morphology variation when forming perovskite from $PbCl_2$ at 90° C. after 500 seconds using the following MAI concentrations: (a) 3 mg/ml, (b) 4 mg/ml, (c) 5 mg/ml, (d) 6 mg/ml, (e) 7 mg/ml.
Figure 20:
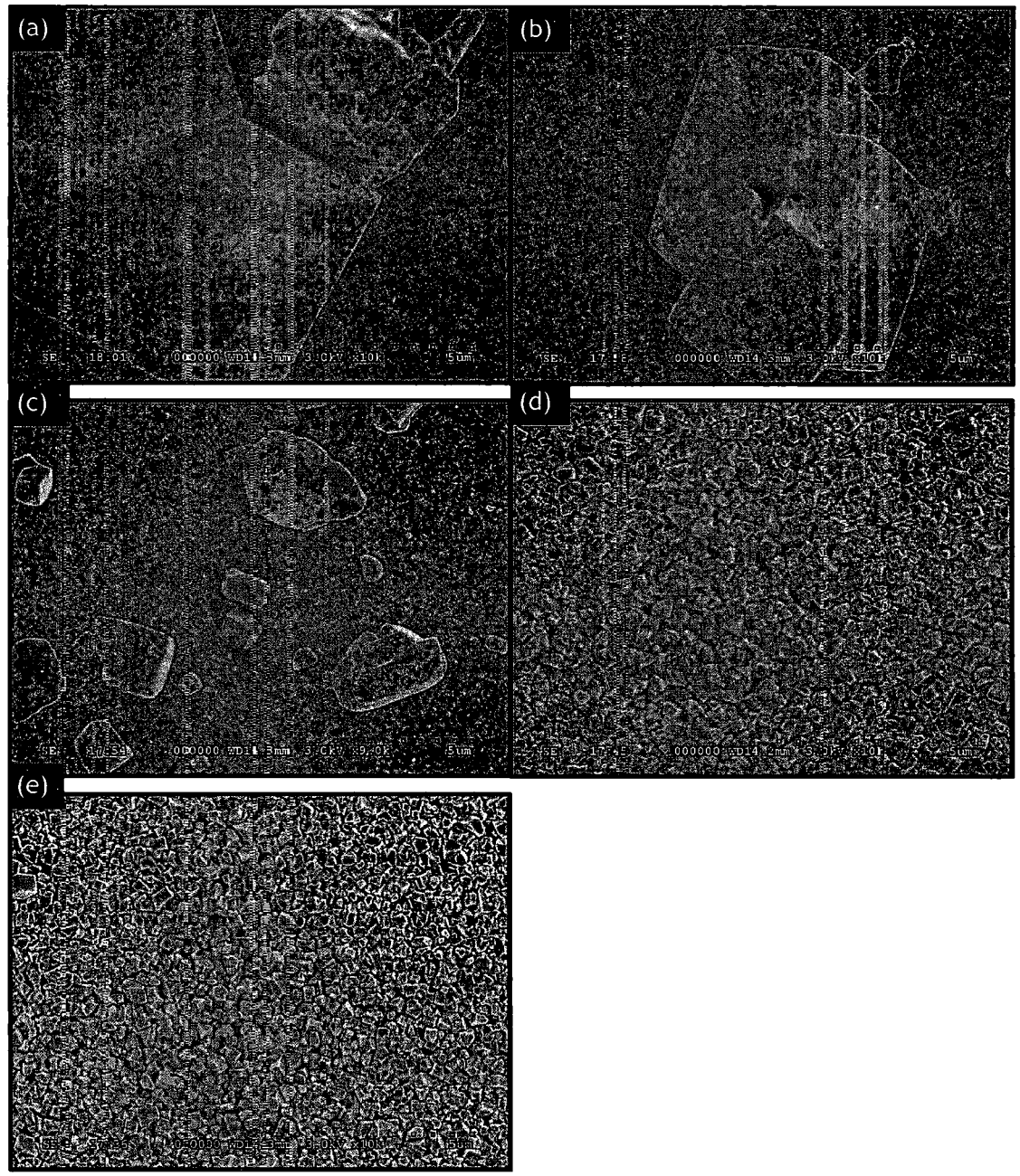
FIG. 20 shows morphology variation when forming perovskite from $PbI_2$ at 90° C. after 500 seconds using the following MAI concentrations: (a) 3 mg/ml, (b) 4 mg/ml, (c) 5 mg/ml, (d) 6 mg/ml, (e) 7 mg/ml.

Variation in the concentration of the MAI solution was also investigated. FIG. 19 shows morphology variation when forming perovskite from $PbCl_2$ at 90° C. after 500 seconds using the following MAI concentraions: (a) 3 mg/ml, (b) 4 mg/ml, (c) 5 mg/ml, (d) 6 mg/ml, (e) 7 mg/ml. FIG. 20 shows morphology variation when forming perovskite from PbI2 at 90° C. after 500 seconds using the following MAI concentraions: (a) 3 mg/ml, (b) 4 mg/ml, (c) 5 mg/ml, (d) 6 mg/ml, (e) 7 mg/ml.

Figure 21:
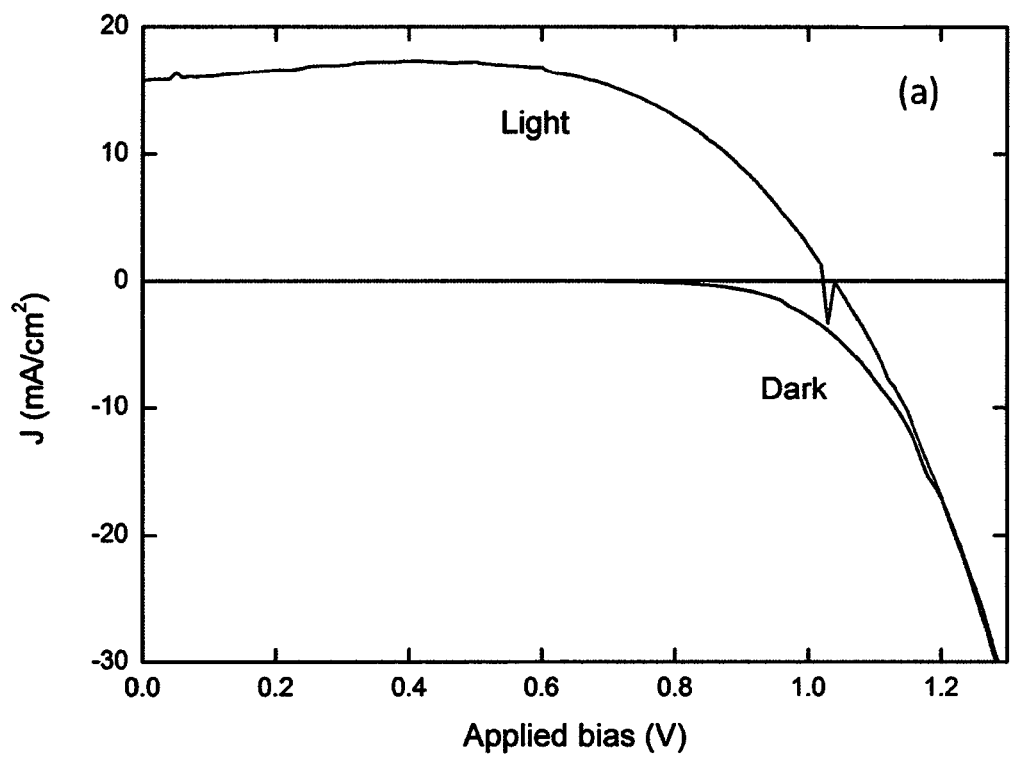
FIG. 21 shows current density-voltage characteristics for the highest efficiency device based on an active layer formed by dip coating of a $PbCl_2$ film at 90° C. in a solution of 6.5 mg/ml MAI in isopropanol for 400s.
Figure 22:
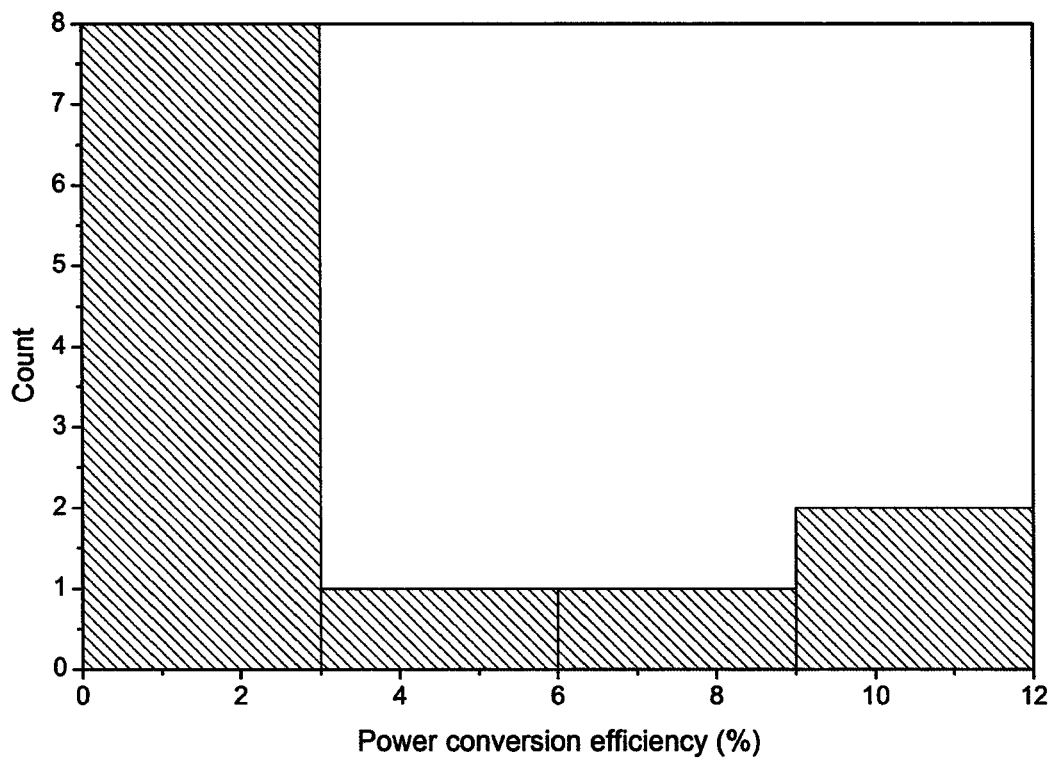
FIG. 22 shows a histogram of device efficiencies from 12 devices fabricated by vapour-solution method.
Figure 23:
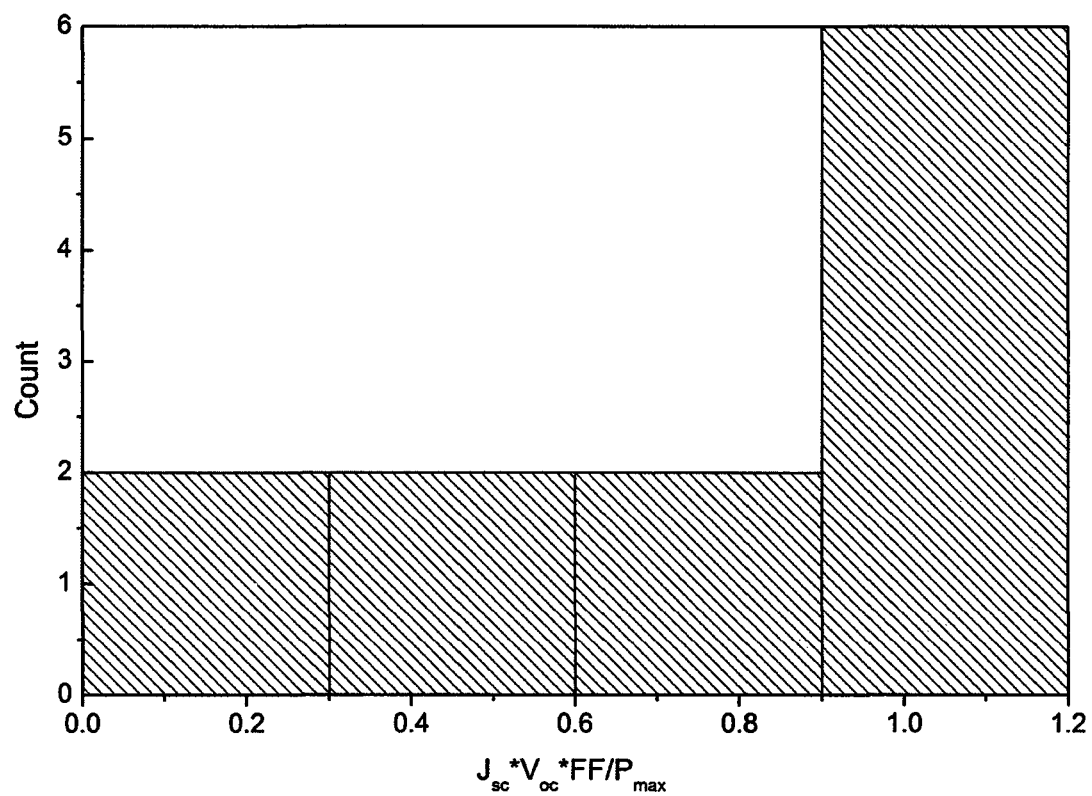
FIG. 23 shows a histogram of J-V curve stabilities for 12 devices fabricated by vapour-solution method.

The current density-voltage characteristics from devices based on an active layer formed by dip coating of a $PbCl_2$ film at 90° C. in a solution of 6.5 mg/ml MAI in isopropanol for 400 s as described above are shown in FIGS. 21, 22 and 23. The device structure is a planar heterojunction with $TiO_2$ coated onto the FTO-coated glass substrate as the electron-selective contact, and silver on spiro-OMeTAD deposited on top of the perovskite layer as the hole-selective contact. FIG. 21 shows the J-V characteristics of the highest efficiency device (efficiency=$P_{max}/P_{in}$). This curve shows significant instability ($J_{sc}$ is lower than J at maximum power output) suggesting that maximum power extracted based on the curve will be unstable. FIG. 22 shows a histogram of device efficiencies from 12 devices fabricated in the same batch suggesting that devices fabricated with this procedure have a high failure rate. FIG. 23 shows a histogram of J-V curve stability based on the ratio of the expected power output of the device based on the fundamental J-V parameters to the maximum power output, $P_{max}$=J*V evaluated at V where $$\frac{dP}{dV} = 0.$$

This suggests that unstable device characteristics are obtained for a significant proportion of devices following the vapour/solution technique, Example 4

A two-step process was used to produce further perovskite materials. Formamidinium lead triiodide was produced by converting a layer of lead iodide of approximately 160 nm thickness by exposure to a non-directional vapour of formamindinium iodide (FAI) at approximately 1 mbar for 120 minutes at 170° C. by placing the $PbI_2$ layer in a heated chamber with FAI powder.

Figure 24:
FIG. 24 shows a top-view SEM of the surface of a formamidinium lead triiodide layer produced by two-step vapour deposition.
Figure 25:
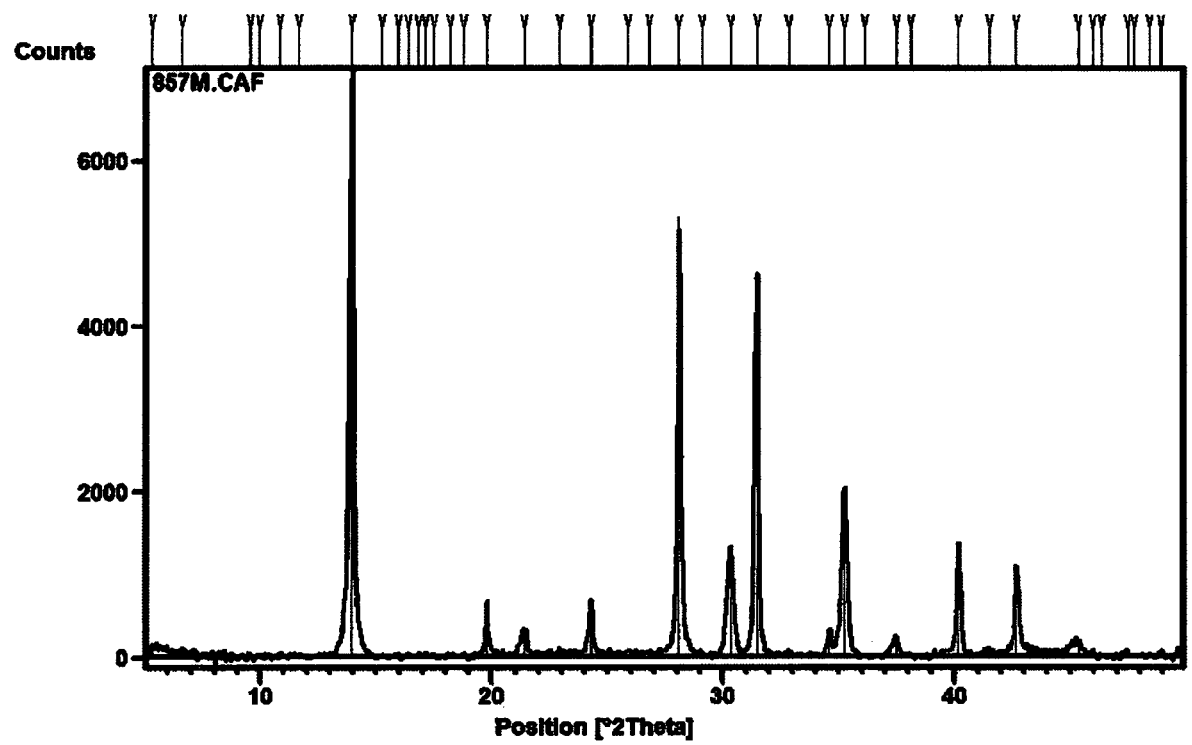
FIG. 25 shows a XRD pattern taken of a formamidinium lead triiodide layer produced by two-step vapour deposition.
Figure 26:
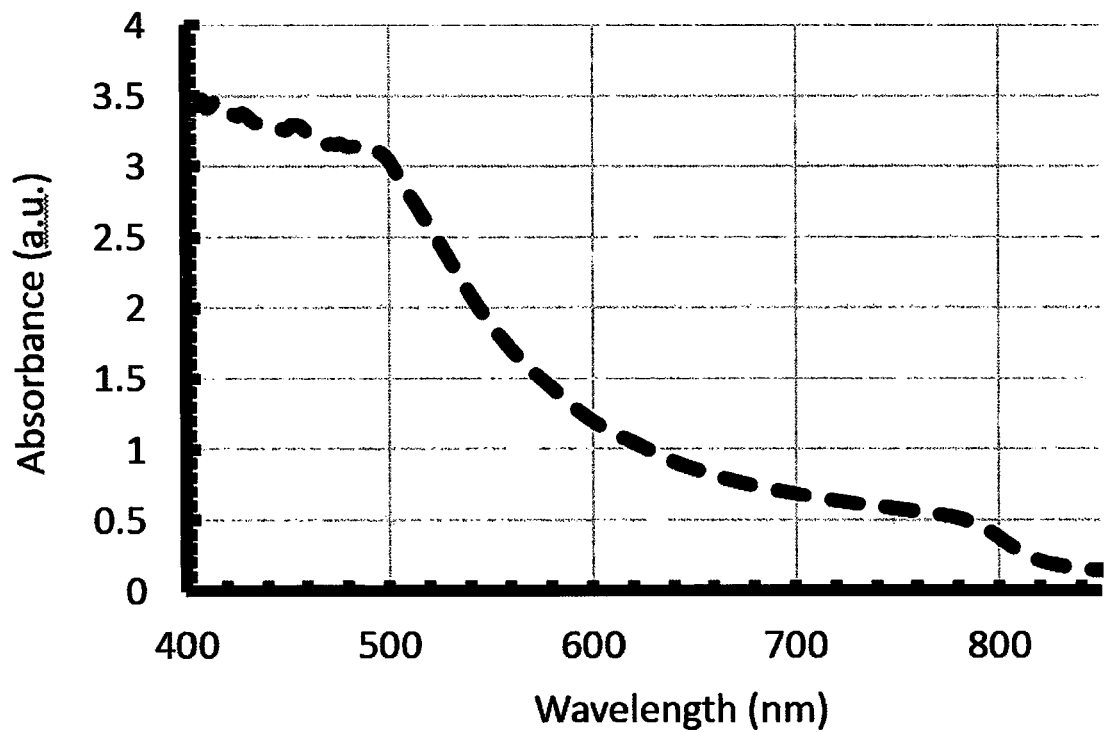
FIG. 26 shows the UV-vis absorbance spectra of a formamidinium lead triiodide layer produced by two-step vapour deposition.

FIG. 24 shows a top-view SEM of the surface of the formamidinium lead triiodide produced. The formation of $FAPbI_3$ can be seen by comparison with FIG. 2, which shows the XRD pattern of evaporated $PbI_2$, with FIG. 25 which shows a XRD pattern taken of the film after exposure of the $PbI_2$ layer to the FAI vapour. The formation of $FAPbI_3$ can also be observed from FIG. 26 which shows the UV-vis absorbance spectra of the formamidinium lead triiodide films produced after exposure of the $PbI_2$ to the FAI vapour.

In order to provide a comparison with a vacuum based methods at atmospheric pressure, an attempt to produce a layer of formamidinium lead triiodide by was performed. However, at atmospheric pressure there was insufficient FAI vapour pressure to drive the conversion of the $PbI_2$ layer. In order to overcome this lack of vapour pressure, the temperature of the conversion chamber was increased, which lead to decomposition/degradation of the layer resulting in unsuccessful formation of any formamidinium lead triiodide.

The invention claimed is:

1. A process for producing a layer of a crystalline material comprising a perovskite or a hexahalometallate, which process comprises:
    (i) a physical vapour deposition step comprising exposing a substrate to a vapour comprising a first precursor compound in a first chamber to produce a layer of the first precursor compound on the substrate; and
    (ii) a chemical vapour deposition step comprising exposing the layer of the first precursor compound to a vapour comprising a second precursor compound in a second chamber to produce the layer of a crystalline material,
wherein:
    the pressure in the first chamber is less than or equal to $10^{-3}$ mbar;
    the pressure in the second chamber is greater than or equal to 1 mbar;
    the first precursor compound comprises one or more first cations and one or more first anions; and
    the second precursor compound comprises one or more organic cations and one or more second anions.

2. A process according to claim 1, wherein in step (i) the substrate is exposed to a directional vapour comprising the first precursor compound.

3. A process according to claim 1, wherein in step (ii) the layer of the first precursor compound is exposed to a non-directional vapour comprising the second precursor compound.

4. A process according to claim 1, wherein the crystalline material consists essentially of a perovskite or a hexahalometallate.

5. A process according to claim 1, wherein the crystalline material comprises a perovskite of formula (II):

[A][B][X]$_3$      (II)

wherein:
    [A] is at least one organic monocation;
    [B] is at least one metal cation, wherein [B] comprises at least one selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$; and
    [X] is at least one halide anion.

6. A process according to claim 5, wherein [A] comprises one or more organic cations selected from $(CH_3NH_3)^+$, $(CH_3CH_2NH_3)^+$, $(CH_3CH_2CH_2NH_3)^+$, $(N(CH_3)_4)^+$, $(H_2N—C(H)=NH_2)^+$ and $(H_2N—C(CH_3)=NH_2)^+$.

7. A process according to claim 5, wherein [A] comprises one or more cations selected from $(CH_3NH_3)^+$, $(H_2N—C(H)=NH_2)^+$ and $Cs^+$.

8. A process according to claim 1, wherein the crystalline material comprises a hexahalometallate of formula (III):

$$[A]_2[B][X]_6 \quad (III)$$

wherein:
[A] is at least one organic monocation;
[M] is at least one metal or metalloid tetracation; and
[X] is at least one halide anion.

9. A process according to claim 1, wherein the pressure in the first chamber is less than or equal to $10^{-3}$ mbar.

10. A process according to claim 1, wherein the first chamber and the second chamber are the same chamber or different chambers.

11. A process according to claim 1, wherein the mean free path of the vapour of the first precursor compound is greater than or equal to 10 mm or the mean free path of the vapour of the second precursor compound is less than or equal to 0.1 mm.

12. A process according to claim 1, wherein the temperature of the second chamber is greater than or equal to 100° C.

13. A process according to claim 1, wherein (i) the first precursor compound comprises a metal cation and one or more first anions and (ii) the second precursor compound comprises an organic monocation and one or more second anions.

14. A process according claim 13, wherein the metal cation is selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, and $Te^{4+}$;
the one or more first anions are selected from halide anions;
the organic monocation is selected from an organic ammonium cation and an organic formamidinium cation, or a caesium cation; and
the one or more second anions is a halide anion.

15. A process according to claim 14, wherein:
the metal cation is selected from $Cu^{2+}$, $Ge^{2+}$, $Sn^{2+}$, $Pb^{2+}$;
the one or more first anions are selected from $F^-$, $Cl^-$, $Br^-$, and $I^-$;
the monocation is selected from organic cations of formula $(R^5NH_3)^+$ wherein $R^5$ is a unsubstituted or substituted $C_{1-20}$ alkyl group or an unsubstituted or substituted aryl group; or
the one or more second anions are selected from $F^-$, $Cl^-$, $Br^-$, and $I^-$.

16. A process according to claim 13, wherein:
the first precursor compound is a compound of formula $BX_2$ wherein B is said metal cation and X is a halide anion; or the second precursor compound is a compound of formula AX' wherein A is said organic monocation and X' is a halide anion.

17. A process according to claim 1, wherein the first precursor compound is a lead dihalide, a tin dihalide or a copper dihalide, and the second precursor compound is an alkylammonium halide, a formamidinium halide or a caesium halide.

18. A process according to claim 1, wherein the substrate comprises a layer of an n-type semiconductor or a layer of a p-type semiconductor.

19. A process according to claim 1, wherein the substrate comprises a layer of a porous scaffold material.

20. A process according to claim 1, wherein the thickness of the layer of the first precursor compound is from 50 nm to 1000 nm.

21. A process according to claim 1, which process further comprises: (iii) exposing the layer of the crystalline material to a vapour comprising a solvent.

22. A process according to claim 1, which process further comprises: (iv) heating the layer of the crystalline material to a temperature of from 50° C. to 250° C.

23. A process for producing a semiconductor device comprising a layer of a crystalline material,
wherein the process comprises producing said layer of a crystalline material by a process comprising:
(i) a physical vapour deposition step comprising exposing a substrate to a vapour comprising a first precursor compound in a first chamber to produce a layer of the first precursor compound on the substrate; and
(ii) a chemical vapour deposition step comprising exposing the layer of the first precursor compound to a vapour comprising a second precursor compound in a second chamber to produce the layer of a crystalline material,
wherein:
the pressure in the first chamber is less than or equal to $10^{-3}$ mbar;
the pressure in the second chamber is greater than or equal to 1 mbar;
the first precursor compound comprises one or more first cations and one or more first anions; and
the second precursor compound comprises one or more organic cations and one or more second anions.

24. A process according to claim 23, which process further comprises disposing on the layer of a crystalline material a layer of a p-type semiconductor or a layer of a n-type semiconductor.

25. A process according to claim 24, which process further comprises disposing on the layer of the p-type semiconductor or n-type semiconductor a layer of a second electrode material.

26. A process according to claim 23, wherein the semiconductor device is an optoelectronic device.

27. A process according to claim 1, wherein the pressure in the second chamber is greater than or equal to 100 mbar.

* * * * *

UNITED STATES PATENT AND TRADEMARK OFFICE
CERTIFICATE OF CORRECTION

PATENT NO. : 10,580,585 B2
APPLICATION NO. : 15/323823
DATED : March 3, 2020
INVENTOR(S) : Henry J. Snaith et al.

It is certified that error appears in the above-identified patent and that said Letters Patent is hereby corrected as shown below:

In the Specification

Column 1, Line 64, "Gräzel" should be --Grätzel--.

Column 2, Line 20, "Willis" should be --terms--.

Column 6, Line 42, "taint" should be --term--.

Column 7, Line 20, "alkane" should be --alkenyl--.

Column 7, Line 25, "$C_{24}$" should be --$C_{2-4}$--.

Column 7, Line 52, "fiiranyl" should be --furanyl--.

Column 12, Line 33, "$Rb^{+}$" should be --$Rb^{+}$--.

Column 14, Line 62, "$CH_3NH_3\ CuF_{3-x}I_x$" should be --$CH_3NH_3CuF_{3-x}I_x$--.

Column 16, Line 54, "$Se^{4+}$" should be --$Sn^{4+}$--.

Column 23, Line 59, "10 nun" should be --10 mm--.

Column 27, Line 27, "200 11M" should be --200 nm--.

In the Claims

Column 37, Claim 15, Line 44, "$Sn^{2+}, Pb^{2+}$" should be --$Sn^{2+}$, and $Pb^{2+}$--.

Signed and Sealed this
Ninth Day of June, 2020

Andrei Iancu
*Director of the United States Patent and Trademark Office*